US006693815B2

(12) United States Patent
Mattausch et al.

(10) Patent No.: US 6,693,815 B2
(45) Date of Patent: Feb. 17, 2004

(54) SEMICONDUCTOR ASSOCIATIVE MEMORY

(75) Inventors: Hans Jurgen Mattausch, Higashihiroshima (JP); Takayuki Gyoten, Kobe (JP)

(73) Assignee: President of Hiroshima University, Higashihiroshima (JP)

( * ) Notice: Subject to any disclaimer, the term of this patent is extended or adjusted under 35 U.S.C. 154(b) by 198 days.

(21) Appl. No.: 10/050,119

(22) Filed: Jan. 18, 2002

(65) Prior Publication Data

US 2002/0125500 A1 Sep. 12, 2002

(30) Foreign Application Priority Data

Jan. 19, 2001 (JP) ........................................ 2001-011760

(51) Int. Cl.$^7$ ............................................. G11C 15/00
(52) U.S. Cl. ................... 365/49; 365/189.07; 365/154; 365/156
(58) Field of Search ............................. 365/49, 189.07, 365/154, 156

(56) References Cited

U.S. PATENT DOCUMENTS 6,362,993 B1 * 3/2002 Henderson et al. ........... 365/49
6,577,520 B1 * 6/2003 Mick ............................ 365/49

OTHER PUBLICATIONS

Akira Nakada, et al. "A Fully Parallel Vector–Quantization Processor for Real–Time Motion–Picture Compression", IEEE Journal of Solid–State Circuits, vol. 34, No. 6, Jun. 1999, pp. 822–829.

T. Nozawa, et al. "A Parallel Vector Quantization Processor Eliminating Redundant Calculations for Real–time Motion Picture Compression", 2000 IEEE International Solid–State Circuits Conference, Feb. 8, 2000, pp. 234–235, and 460.

Sateh M. S. Jalaleddine, et al. "Associative IC Memories with Relational Search and Nearest–Match Capabilities", IEEE Journal of Solid–State Circuits, vol. 27, No. 6, Jun. 1992, pp. 892–900.

R.G. Carvajal, et al. High–speed high–precision min/max circuits in CMOS technology, Electronics Letters, vol. 36, No. 8, Apr. 13, 2000, pp. 697–699.

Hans Jurgen Mattausch, et al. "An Architecture for Compact Associative Memories with Deca–ns Nearest–Match Capability up to Large Distances", 2001 IEEE International Solid–State Circuits Conference, Feb. 6, 2001, pp. 170–171, and 443.

Hans P. Graf, et al. "Analog Electronic Neural Network Circuits", IEEE Circuits and Devices Magazine, vol. 5, Jul. 1989, pp. 44–49, and 55.

(List continued on next page.)

Primary Examiner—Richard Elms
Assistant Examiner—Anh Phung
(74) Attorney, Agent, or Firm—Oblon, Spivak, McClelland, Maier & Neustadt, P.C.

(57) ABSTRACT

An associative memory composed of plural chips or a single chip which is preferably used in the fields of bandwidth compression for video images in mobile communication terminals and artificial intelligence systems. The associative memory is a small-area associative memory formed using CMOS technology with a fast parallel minimum-distance-search capability. The transistor number of the provided search circuit is only linear proportional to the number of rows of the associative memory. Therefore, the increase in the number of required circuits is small even if the unit number of the input data or the unit number of the reference data is large. With the associative memory, it is possible to realize the functions of video signal compression and object recognition necessary for artificial intelligence systems, data bank systems and mobile network terminals with a single chip or plural chips.

57 Claims, 11 Drawing Sheets

OTHER PUBLICATIONS

J. Lazzaro, et al. "Winner–Take–All Networks of O (N) Complexity", Advances in Neural Information Processing Systems, pp. 703–711.

W. R. Daasch, et al., Asic Conference and Exhibit, Proceedings, Seventh Annual IEEE International, XP–010140532, pp. 25–28, "A Word/Bit Parallel Inexact Match Content Addressable Memory", Sep. 19, 1994.

W. R. Daasch, Electronic Letters, vol. 27, No. 18, XP–000264473, pp. 1623–1625, "Inexact Match Associative Memory Cell", Aug. 29, 1991.

C–K. Pham, et al., Proceedings of the International Symposium on Circuits and Systems, vol. 2, XP–010115780, pp. 2752–2755, "CMOS Digital Retina Chip with Multi–Bit Neurons for Image Coding", May 3, 1993.

L. G. Johnson, et al., Electronics Letters, vol. 27, No. 11, XP–000232447, pp. 957–958, "MOS Implementation of Winner–Take –All Network with Application to Content–Addressable Memory", May 23, 1991.

S. Bibyk, et al., Proceedings of the International Joint Conference on Neural Networks, vol. I, XP–000239698, pp. I–557–I–562, "Neural Circuit Architectures for Real–Time Signal Processing in Video Rate Communication Systems", Jul. 8–12, 1991.

* cited by examiner

SEMICONDUCTOR ASSOCIATIVE MEMORY

CROSS-REFERENCE TO RELATED APPLICATIONS

This application is based upon and claims the benefit of priority from the prior Japanese Patent Application No. 2001-011760, filed Jan. 19, 2001, the entire contents of which are incorporated herein by reference.

BACKGROUND OF THE INVENTION

1. Field of the Invention

The present invention relates to an associative memory and more particularly to a small-area, associative memory with fast parallel minimum-distance-search capability, used for artificial intelligence systems, data-bank systems, mobile network terminals and the like.

2. Description of the Related Art

Conventionally, an associative memory is activated by searching for the "best match data" between an input data composed of W units, each k bits long, and R reference data, each also composed of W units, each k bits long. The associative memory has a function of generating comparative bits to clarify the best match data by comparing stored reference data with input data, also called search data or match data, input from outside.

The "best match data" is defined as data with the smallest measure, which is of distance here. As the measure of distance, conventionally, the Hamming distance and Manhattan distance are best known. The Hamming distance is used for data strings, voice patterns, black-and-white pictures and the like, and the Manhattan distance is used for color pictures, gray-scale pictures and the like.

If the bit length of a unit of input data or reference data is 1 bit (k=1), the Hamming distance is applied. That is, the Hamming distance is defined as the number of bits that are different from each other in two items of data to be compared.

On the other hand, if the input data is composed of units of coded numbers such as $X_{in}=\{x_1, x_2, x_3, \ldots x_W\}$, $Y_{ref}=\{y_1, y_2, y_3, \ldots y_W\}$, the Manhattan distance is applied. At this time, the Manhattan distance between two items of data is defined as follows.

$$D_{Manh} \equiv \sum_{i=1}^{W} |x_i - y_i| \quad (1)$$

Basically, the following methods have been used to search for the best matching of most similar data (hereinafter referred to as the winner) according to conventional art. That is, (a) Use of an analog neural network (H. P. Graf and L. D. Jackel, "Analog Electronic Neural Network Circuits", IEEE Circuits and Device Mag., vol. 5, p. 44, 1989), (b) Use of plural SRAMs and separate digital search circuits (A. Nakada et al., "A Fully Parallel Vector-Quantization Processor for Real-Time Motion Picture Compression", IEEE Journ. Solid-State Circuits, vol. 34, pp. 822–830, 1999; T. Nozawa et al., "A Parallel Vector Quantization Processor Eliminating Redundant Calculations for Real-time Motion Picture Compression", ISSCC Digest of Tech. Papers, pp. 234–235, 2000), (C) Use of an analog winner-take-all circuit (Analog Winner-Take-All circuit; WTA circuit) employing MOS transistors used as source-followers (S. M. S. Jalalenddine and L. G. Johnson, "Associative IC Memories with Relational Search and Nearest-Match Capabilities", IEEE Journ. Solid-State Circuits, vol. 27, pp. 892–900, 1992).

However, these methods have the following problems. That is, because the circuit complexity of the search circuit increases in order of $R^2$ ($O(R^2)$) or in order of $R*W$ ($O(R*W)$), the occupied area in a chip increases (see the documents in (a) and (b), above) and furthermore the time necessary for searching is increased (about 1 $\mu$s). Another problem is that the searchable range only extends to a small W (see the document in (c), above).

Conventionally, in an artificial intelligence system using associative memory, hardware having a high area efficiency is almost impossible to achieve; therefore, generally, artificial intelligence systems are constructed on high-performance computers using complicated software.

There have not yet been any mobile terminals capable of video communication. The reason is that if video data-compression technologies such as MPEG are employed, a tremendous amount of hardware is needed in the sender/receiver terminal. With an associative memory, a data compression method based on a code book can be used (A. Nakada et al., "A Fully Parallel Vector-Quantization Processor for Real-Time Motion Picture Compression", IEEE Journ. Solid-State Circuits, vol. 34, pp. 822–830, 1999).

According to this method, first, a data stream is divided into blocks of a specified number of bits and next, best match blocks, which are those most similar to the ones in the code book, are determined using the associative memory. In the final stage, only the identifier of a block is transmitted to the receiver. The data transmitted in this way is reconstructed according to the code book. Therefore, the receiver can be constructed with a very simple structure.

This technology is suitable for transmission of video signals and is called vector quantization. The associative memory of the present invention is advantageously used in fields of bandwidth compression of video signal in mobile communication terminals, artificial intelligence systems, data bank systems and the like with plural compact chips or a single compact chip.

As described above, the problem with the conventional winner search method is that if the unit number W of input data or the number R of reference data increases, the circuit complexity of the search circuit strongly increases proportionally to $R^2$ so that the required chip area strongly increase and searching takes longer.

The present invention has been developed to solve the above problems and, therefore, an object of the present invention is to provide an associative memory capable of fast parallel searching with a search circuit implemented on a small chip area by avoiding an increase in the number of circuits proportionally to $R^2$ and reducing this increase to be proportional to R. Such an associative memory is intended to be applied to the fields of bandwidth compression of video signals in mobile communication, including mobile network terminals, artificial intelligence and the like.

BRIEF SUMMARY OF THE INVENTION

To achieve the above-described objective according to the present invention, there is an associative memory with a fast parallel minimum-distance-search capability, which is formed of a CMOS circuit, realizing fast search with a small chip area by avoiding a strong increase in the number of circuits even if the unit number W of the input data or the number R of the reference data is large.

Specifically, the present invention provides a semiconductor associative memory including a memory array comprising: unit storage circuits each having k bits arranged in R rows of W columns (R, W, k are natural numbers); unit comparison circuits arranged in R rows of W columns for comparing input data of W×k bits with reference data of W k-bit units stored in the unit storage circuits at every k bit; weighted word comparators for weighting each bit of output data output from each row of the unit comparison circuit; row decoders of R rows; and column decoders of W×k columns.

Preferably, the unit in the memory array is composed of binary-coded data and the bit number k of the unit is k=1 in the case where the Hamming distance is used to search for reference data matching with the input data and k>1 in the case where the Manhattan distance is used.

Further, preferably, in the case where the retrieval of the reference data based on the input data is carried out using the Hamming distance, the unit storage circuit is composed of an SRAM memory cell, the unit comparison circuit comprises a 2-input EXOR circuit or a 2-input EXNOR circuit each connected to the complementary output portion of a latch circuit constituting the SRAM memory cell, the weighted word comparator including a transistor, or two transistors connected to each other in series connected to the 2-input EXOR circuit or EXNOR circuit.

Further, preferably, in the case where retrieval of the reference data based on the input data is carried out using the Manhattan distance, the unit storage circuit includes a complementary input section and a complementary output section of k (>1) bits, the unit comparison circuit includes a function for subtracting the output signal of the complementary output section from the input signal of the complementary input section and a function for calculating the absolute value of the result of the substraction, the weighted word comparator comprises transistors or groups of two transistors connected to each other in series connected to each of the k bits of the output portion of the unit comparison circuit.

Further, preferably, weighting of the output data in the weighted word comparator is carried out by selecting the value of the ratio of the gate width to the gate length of any one of the one transistor or the two transistors connected to each other in series, constituting the weighted word comparator.

Further, preferably, the semiconductor associative memory comprises a winner line-up amplifier providing connections to each row of the memory array, the winner line-up amplifier consisting of a winner/loser distance amplification unit, a feedback signal generation section included in the winner/loser distance amplification unit, a comparison signal regulation unit for regulating the comparison signal of the weighted word comparator of each of the W rows so that the amplification factor of the winner/loser distance amplification unit is maximized using a feedback signal output from the feedback signal generation section, and a feedback signal coding section for outputting the match quality of the winner by coding the feedback signal.

Further, preferably, the winner/loser distance amplification unit comprises a push-pull amplifier, two transistors for receiving an inverted and not-inverted enable signals and a compensation capacitor provided on each row of the memory array, as well as the feedback signal generation section consisting of a source-follower pull-down transistor provided on each row of the memory array for receiving the output of the push-pull amplifier to the gate, and pull-up transistors common to all rows of the memory array and connected to each of the pull-down transistors in series.

Further, preferably, the comparison signal regulation unit comprises a pass transistor for regulating the output signal current from the weighted word comparator, and a source-follower pull-up transistor for converting the output signal current to an intermediate potential, wherein the feedback signal is input to the gate of the source-follower pull-up transistor while the enable signal is input to the gate of the pass transistor.

Further, preferably, the winner/loser distance amplification unit comprises a current mirror amplifier and a compensation capacitor provided on each row of the memory array, as well as the feedback signal generation section including a Min/Max circuit which operates at high speeds. Further, preferably, the comparison signal regulation unit includes a source-follower pull-up transistor for converting the output signal current from the weighted word comparator to an intermediate potential, and a level shifter for shifting the feedback signal in terms of its voltage level and inputting the signal into the source of each transistor constituting the weighted word comparator.

Further, preferably, the semiconductor associative memory comprises a winner-take-all circuit providing connections to each output of the winner-line-up amplifier, the winner-take-all circuit including a level shifter configured as required, winner-take-all amplifiers of n stages (n is a positive integer) in order to amplify the output signal of the winner/loser distance amplification unit further, and a final decision circuit connected to the output portion of the n-th stage of the winner-take-all amplifier.

Further, preferably, a winner-take-all amplifiers includes a level shifter and a winner-take-all amplifier of a single stage; the level shifter regulating the level of the output signal voltages of the winner/loser distance amplification unit so that the amplification factor of the winner-take-all amplifier of the single stage is maximized; the winner-take-all amplifier of the single stage including transistors for converting the level shifter output signal voltages to current changes in the amplifier and transistors for converting the current changes in the amplifier to output signal voltages of the winner-take-all amplifier of the single stage; the winner-take-all amplifier of the single stage including a final decision circuit, provided at the output portion thereof, composed of inverters with adjusted switching-threshold voltages so as to match the output signal voltages of the winner-take-all amplifier.

Further, preferably, the winner-take-all circuit includes a level shifter and winner-take-all amplifiers of n stages (n is an integer greater than 1); the level shifter regulating the level of the output signal voltages of the winner/loser distance amplification unit so that the amplification factor of the winner-take-all amplifier of the first stage is maximized; the winner-take-all amplifier of the first stage including transistors for converting the level shifter output signal voltages to current changes in the amplifier and transistors for converting the current changes in the amplifier to output signal voltages of the winner-take-all amplifier of the first stage; the winner-take-all amplifier of the i-th stage (i is an integer greater than 1 but less than n) including transistors for converting the output signal voltages of the (i−1)-th stage to current changes in the amplifier of the i-th stage and transistors for converting the current changes in the amplifier of the i-th stage to output signal voltages of the winner-take-all amplifier of the i-th stage; the winner-take-all amplifier of the n-th stage including a final decision circuit, provided at the output portion thereof, composed of inverters with adjusted switching-threshold voltages so as to match the output signal voltages of the winner-take-all amplifier of the n-th stage.

Further, preferably, the feedback signal is input to the source of each transistor constituting the weighted word comparator or the gate of any one of the two transistors connected to each other in series constituting the weighted word comparator.

Further, preferably, when the conductivity type of each transistor constituting the weighted word comparator is inverted, the conductivity type of each transistor constituting the winner/loser distance amplification unit and the feedback signal generation section is inverted, the polarity of the enable signals of the winner/loser distance amplification unit and the feedback signal generation section are reversed and the conductivity type of the transistors constituting the winner-take-all circuit is inverted, while the power supply terminals and grounding terminals of the winner/loser distance amplification unit, the feedback signal generation section and the winner-take-all circuit are exchanged.

Further preferably, the number of transistors constituting the winner line-up amplifier and the winner-take-all circuit is proportional to the number of rows R in the memory field.

DETAILED DESCRIPTION OF THE INVENTION

Hereinafter, the preferred embodiments of the present invention will be described in detail with reference to the accompanying drawings.

First Embodiment

Figure 1:
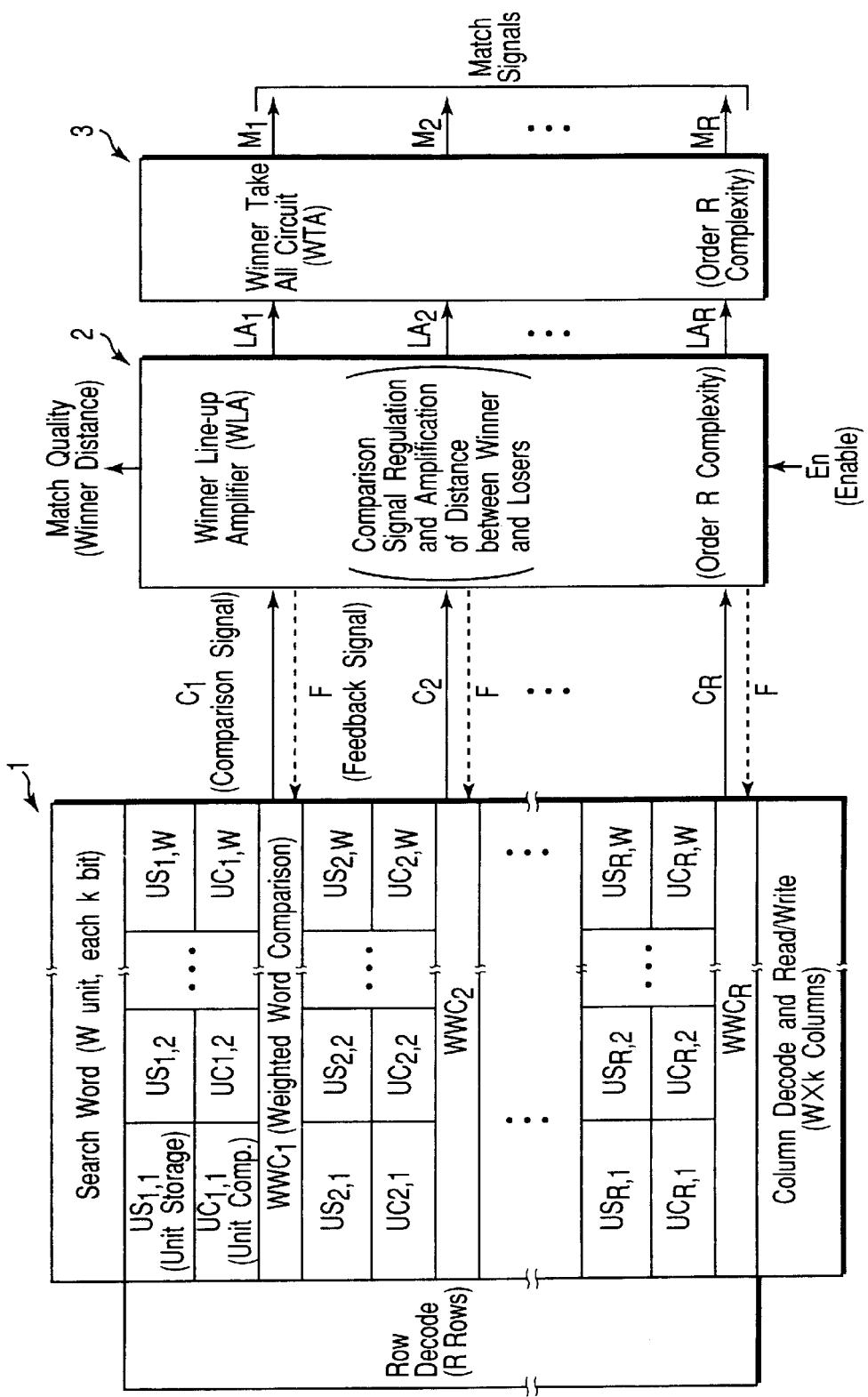
FIG. 1 is a block diagram of an associative memory according to a first embodiment of the invention.

FIG. 1 is a diagram showing a block structure of an associative memory according to a first embodiment of the present invention.

In the associative memory shown in FIG. 1, the memory array 1 comprises unit storage circuits $U_{i,j}$ (i=1 to R, j=1 to W) for data of R rows and W columns comprising integrated unit comparison circuits $UC_{i,j}$ (i=1 to R, j=1 to W) and weighted word comparators $WWC_i$ (i=1 to R). Each unit is composed of k bits.

A row decoder of R rows is connected to a left side of the memory array 1 and an input portion for input data composed of W units each of k bits is disposed on an upper side of the memory array 1. Further, a column decoder of W×k columns is connected to a lower side of the memory array 1 so as to carry out read/write operations for each unit storage circuit.

In a typical case using the Hamming distance, k=1. Further, in a typical case using the Manhattan distance, k>1 and the unit indicates coded binary data. Selection of the winner is carried out by two function blocks of O(R).

The first block is a winner line-up amplifier (WLA) 2, which regulates the level of a comparison signals $C_i$ (i=1 to R) for amplifying the difference in distance between the winner and the losers (hereinafter, reference data that does not match the input data as well as the winner is called a loser) to the largest in a first amplification stage.

The second block is a winner-take-all circuit (WTA) 3, which, after output signals $LA_i$ (i=1 to R) of the WLA 2 are input, outputs match signals $M_i$ (i=1 to R). The match signal $M_i$ is a "1" signal at the winner column and "0" at all other columns. Meanwhile, comparison signals $C_i$ (i=1 to R) of the $WWC_i$ are input to the input portion of the WLA 2 and a feedback signal F is returned from the WLA to the $WWC_i$.

As described in the following embodiments, in order to realize a rapid minimum distance search function for the associative memory shown in FIG. 1, its design has been advanced taking the following two matters into account.

First, by comparing input data with the reference data in the functional block shown in FIG. 1, large and small currents are output at high speed as the comparison signals $C_i$ of the $WWC_i$. Because of this, high-speed analog $WWC_i$ are achieved.

The transistors that constitute this system are designed to turn on in correspondence to, for example, non-matching bits between input data and reference data, and the difference between a good match and a bad match is made to correspond rapidly to the magnitude of the current.

Secondly, an excellent amplification principle for the winner line-up amplifier WLA is achieved. The output level of the $WWC_i$ of the winner row is regulated using the feedback signal so that the amplification degree of the distance between the winner and losers is maximized for all possible cases using this circuit.

Second Embodiment

A second embodiment of the present invention will be described with reference to FIGS. 2A and 2B. In the second embodiment, a concrete circuit structure of a memory array for obtaining the Hamming distance will be described.

Figure 2A:
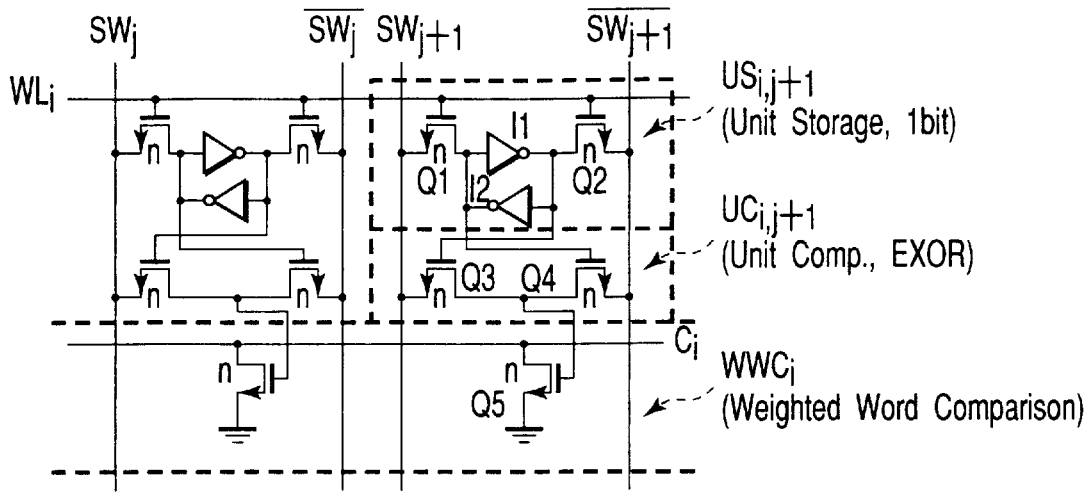
FIG. 2A is a diagram showing a structure of the circuits of a unit comparison circuit using the Hamming distance and a weighted word comparator according to a second embodiment of the invention, and a diagram showing a structure of a circuit employing nMOS-transistors in the weighted word comparator.
Figure 2B:
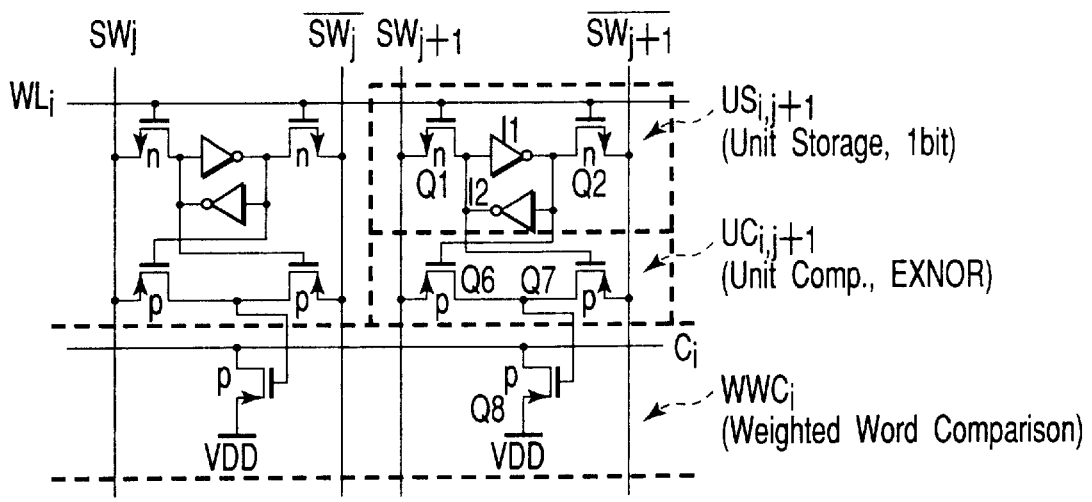
FIG. 2B is a diagram showing a structure of the circuits of the unit comparison circuit using the Hamming distance and the weighted word comparator according to the second embodiment, and a diagram showing the structure of a circuit employing pMOS-transistors in the weighted word comparator.

FIGS. 2A and 2B show circuits each in which a one-bit unit comparison circuit UC and a weighted word comparator WWC (hereinafter $UC_{i,j}$ and $WWC_i$ are generally called UC and WWC), respectively, are integrated in a one-bit unit storage circuit US (hereinafter $US_{i,j}$ is generally called US) composed of an SRAM cell using an n-channel MOS field effect transistor (hereinafter referred to as an nMOS-transistor) and a p-channel MOS field effect transistor (hereinafter referred to as a pMOS-transistor).

In FIGS. 2A and 2B, US consists of a latch circuit comprising nMOS-transistors Q1 and Q2 and inverters I1 and I2. Input data SW (hereinafter SWj is generally called SW) and inverted input data/SW are input to a column line and a complementary column line of the US, respectively. The reference data is stored in the storage circuits US. The nMOS-transistors Q1 and Q2 of the US are selected with a word line WL (hereinafter WLi is generally called WL) only in a different operation mode, when the column lines are used to write new reference data into the US or to read reference data from the US.

In FIG. 2A, functions of the UC and WWC can be achieved by only three nMOS-transistors Q3, Q4 and Q5. Of them, the two nMOS-transistors Q3 and Q4 constituting the UC compare the input data SW and /SW with the reference data stored in US and are used to achieve an EXOR function for determining match or non-match data. The nMOS-transistor Q5 of the WWC is used to contribute an EXOR output to a comparative signal C (hereinafter $C_i$ is generally called C).

If the input data matches the reference data, the value corresponding to "0" (Vss) is selected from input data SW and the inverse input data/SW with the nMOS-transistors Q3 and Q4 and connected to the gate of Q5, so that the nMOS-transistor Q5 of the WWC is turned off. If the input data does not match the reference data, the value corresponding to "1" (Vdd) is selected from input data SW and the inverse input data/SW and connected to the gate of Q5, so that the nMOS-transistor Q5 of the WWC is turned on.

Therefore, the signal current of the comparison signal C is minimized at the winner row (the row in which the total of non-match bits is the smallest), so that the Hamming distance can be obtained by equalizing the gate width and gate length of the nMOS-transistor Q5 of the WWC connected to each UC (equalizing the weight). At this time, if the ratio of the gate width to the gate length of the nMOS-transistor Q5 is changed for each output bit of the WWC, needless to say, retrieval of the winner is enabled by arbitrary weighting, which corresponds to an arbitrary distance measure.

FIG. 2B shows an example in which the UC and WWC are constructed with pMOS-transistors Q6, Q7 and Q8. In this case, if the input data does not match the reference data, the pMOS-transistor Q8 of the WWC is turned on, and if the input data matches the reference data, the pMOS-transistor Q8 is turned off.

Third Embodiment

Next, a third embodiment will be described with reference to FIG. 3.

In the third embodiment, a circuit structure of a memory array for obtaining the Manhattan distance will be described.

Figure 3:
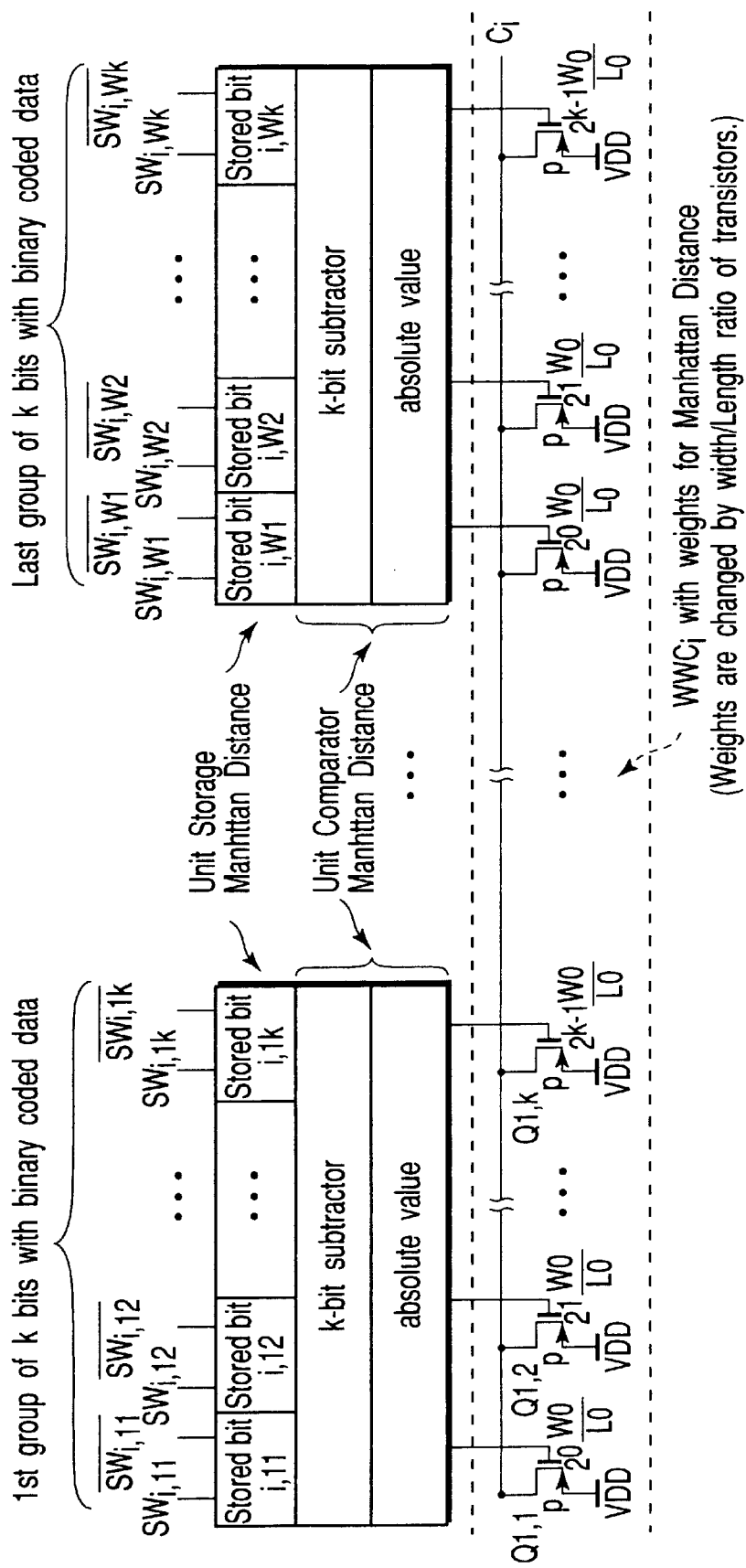
FIG. 3 is a diagram showing a structure of the circuits of a unit comparison circuit using the Manhattan distance and a weighted word comparator according to a third embodiment of the invention.

FIG. 3 shows a circuit in which the unit storage circuit US, unit comparison circuit UC and weighted word comparator WWC are integrated in order to obtain the Manhattan distance by applying coded binary data (k>1) to each unit storage circuit US. As shown in FIG. 3, the US and UC for obtaining the Manhattan distance are constructed using a circuit which stores two k-bits, and a circuit which substracts the input unit from the stored reference unit and outputs an absolute value of the calculation result, respectively.

The WWC part of each k-bit unit is constructed using k pMOS-transistors (for example, Q1, 1 to Q1, k), for example. The ratio of the gate length to the gate width of these pMOS-transistors is selected to correspond to the weight of bits composing the data (for example, the digits of a binary-coded number).

For example, if as a result of obtaining an absolute value after subtracting a k-bit input data SW, /SW from a k-bit reference data stored in US, "1" is output to the most significant bit, a corresponding pMOS-transistor Q1, k is turned on, which has the ratio of the gate length to the gate width set to $2^{k-1}W_0/L_0$ ($W_0$ is the gate width of the least significant bit and $L_0$ is the gate length of the least significant bit). Consequently, a large signal current flows from power supply line VDD. In this way, a contribution to the comparison signal C weighted according to the order of bits can be obtained from the most significant bit to the least significant bit.

Fourth Embodiment

Next, a fourth embodiment of the present invention will be described with reference to FIG. 4.

In the fourth embodiment, a block structure of a winner line-up amplifier WLA 2 of an associative memory, which is a major component of the present invention, will be described.

Figure 4:
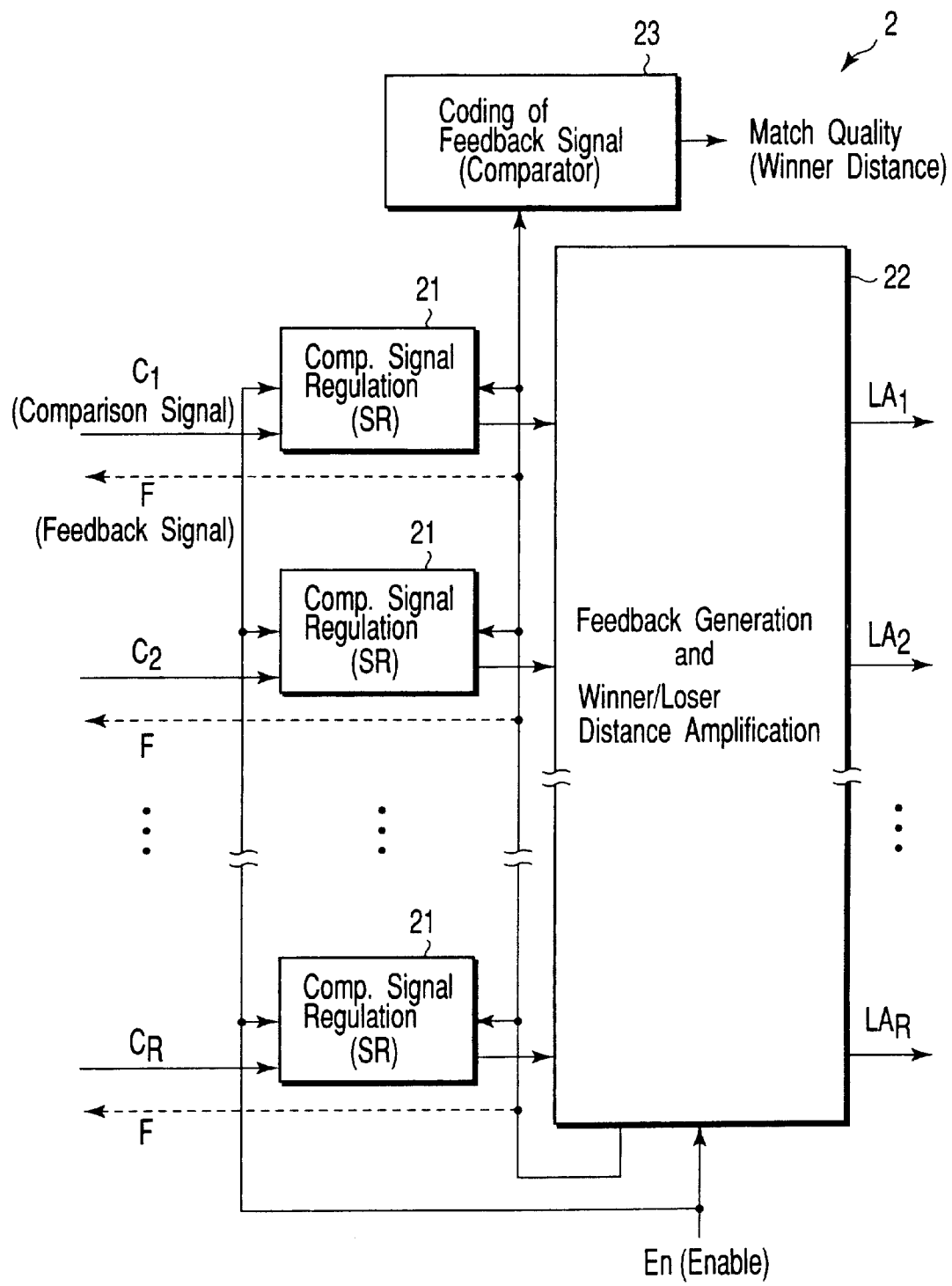
FIG. 4 is a diagram showing a block structure of the winner line-up circuit according to a fourth embodiment of the invention.

The WLA 2 shown in FIG. 4 comprises comparison signal regulation units (SR) 21 having a function for transforming the magnitude of the current of a comparison signal $C_i$ (i=1 to R) generated by a weighted word comparator $WWC_i$ to a voltage signal, a feedback generation and winner/loser distance amplification unit 22, and a feedback signal coding section 23 composed of a comparator having a function for arbitrarily coding match quality between input data and reference data (winner distance).

A generated feedback signal F is fed back to the SR 21, to the feedback signal coding portion 23 and, if appropriate, to the weighted word comparators $WWC_i$, and the effect is that the search capability of the associative memory is raised. Meanwhile, En is an enable signal for the WLA 2 and $LA_i$ (i=1 to R) are amplified output signals of the winner/loser distance amplification unit.

Fifth Embodiment

Next, a fifth embodiment of the present invention will be described with reference to FIG. 5.

In the fifth embodiment, an example of a simple circuit structure of the winner line-up amplifier WLA 2 will be described. The WLA 2 of a circuit complexity O(R) shown in FIG. 5 is composed of about seven transistors per row. In this case, to minimize the area of the memory array, feedback to the WWC is not employed.

Figure 5:
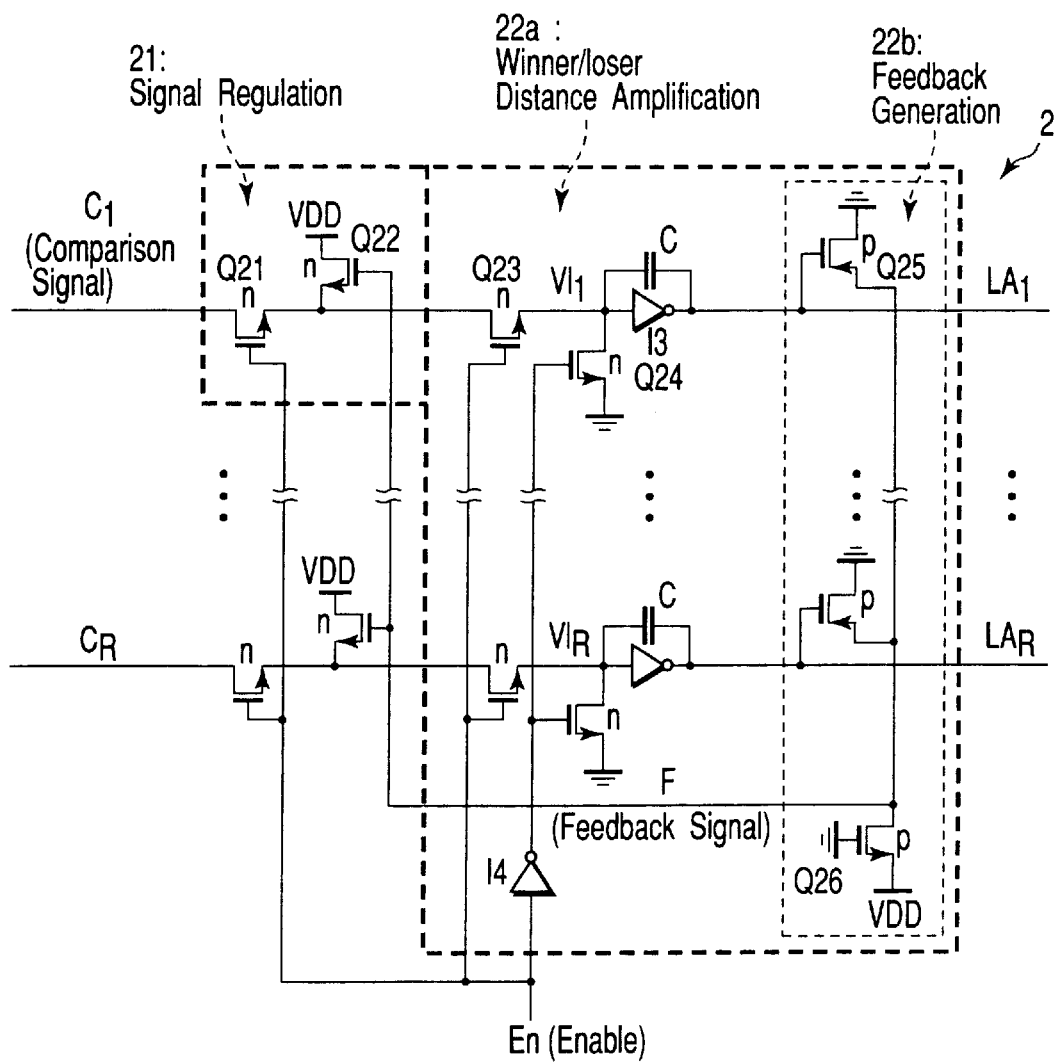
FIG. 5 is a diagram showing a simple winner line-up circuit according to a fifth embodiment of the invention.

In the circuit structure of the WLA 2 shown in FIG. 5, a comparison signal regulation unit 21 is configured for each $C_i$ (i=1 to R) with two nMOS-transistors Q21 and Q22. The nMOS-transistor Q21 is a pass transistor for activating/deactivating the WLA 2 with an enable signal En and regulating the current in the WWC. The nMOS-transistor Q22 is a pull-up transistor of source-follower configuration for transforming the magnitude of current in the WWC to an intermediate potential VI (VI$_1$ in the example shown in the same row of FIG. 5). Meanwhile, a source-follower output (feedback signal F) of an nMOS-transistor Q25 constituting a feedback signal generating portion 22b is input to the gate of the nMOS-transistor Q22.

A winner/loser distance amplification unit 22a is provided with nMOS-transistors Q23 and Q24 for receiving the enable signal En, a push-pull amplifier (PPA) consisting of inverters I3, and compensation capacitors C in each row. If the WLA 2 is inactive, a low En turns the nMOS-transistor Q23 off while a high En, which is made high by an inverter 14, turns the nMOS-transistor Q24 on. Consequently, the input of the PPA becomes 0 V (ground potential).

If the enable signal En is made high, the WLA 2 is activated, so that push-pull amplification by the inverter I3 is executed. The compensation capacitors C assure stable WLA operation with a sufficient margin.

The feedback signal F is generated by pull-down pMOS-transistors Q25 of source-follower configuration which receive the outputs of each row of the WLA 2 on their gates and a pull-up pMOS-transistor Q26 common to all rows of the WLA 2 connected thereto in series. Because, in actual circuit operation, the magnitude of current flowing to the winner row is minimized, an intermediate potential VI$_{win}$ of the winner row becomes the highest, while an output potential LA$_{win}$ of the PPA output through the inverter I3 becomes the lowest.

Therefore, the voltage of the feedback signal F is determined by the winner row and is given as follows. V$_{th,p}$ is a threshold voltage of the pMOS-transistor Q25.

$$F \approx LA_{win} + V_{th,p} \quad (2)$$

Consequently, when the magnitude of current flowing to the SR unit of the winner row is balanced by the magnitude of current flowing through the WWC of the winner row, the WLA is activated in such a region that the amplification of the PPA is maximized. At this time, the intermediate potential of the winner row becomes VI$_{win}$, thereby producing a condition in which the winner is selected stably.

The WLA circuit has a self-adaptive regulation function for automatically regulating each signal in a region in which the distance amplification by the PPAs becomes maximum in all possible cases. Therefore, a point which should be considered when designing the WLA is to design such that the WLA circuit operates over a large regulation range even if a transistor parameter exhibits the worst possible condition as a result of the manufacturing process.

Next, the operation of the WLA will be described further in detail with reference to FIGS. 6A, 6B and 6C.

Figure 6C:
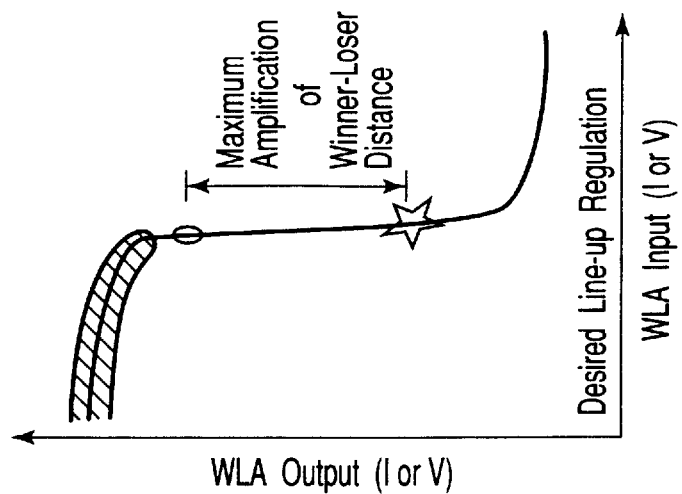
FIG. 6C is a diagram showing the principle of the winner line-up circuit, depicting a desired case of line-up regulation.
Figure 6B:
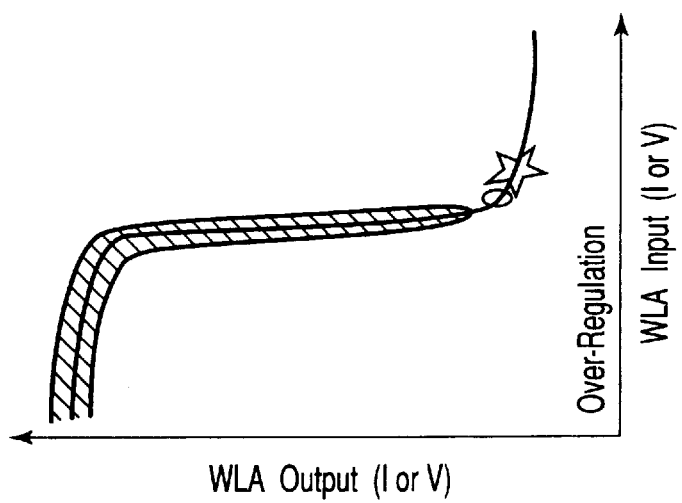
FIG. 6B is a diagram showing the principle of the winner line-up circuit, depicting an undesired case of over-regulation.
Figure 6A:
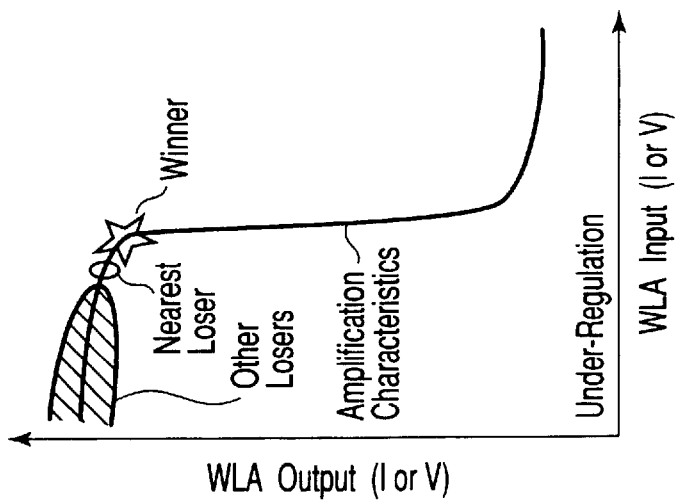
FIG. 6A is a diagram showing the principle of the winner line-up circuit, depicting an undesired case of under-regulation.

FIGS. 6A, 6B and 6C show the current/voltage amplification characteristics of the PPA and in addition the relation between the input of the PPA from the winner row and loser rows and the output of the PPA (output of the WLA).

FIG. 6A shows a state of under-regulation in which regulation of the comparison signal C by the comparison signal regulation unit SR is insufficient. That is, this Figure shows a state in which the current of the comparison signal C corresponding to the winner row is excessive and therefore the input signal voltage of the PPA drops; the input signal voltage of the PPA corresponding to the winner row and the nearest loser row, in which the current of the comparison signal C is larger than the winner row, drops; the input signal voltage of the PPA corresponding to other loser rows, in which the current of the comparison signal C is large, drops; and then, the output of the PPA deviates toward the high side of the amplification characteristic (on the characteristic of the inverter I3). In this case, identification of the winner row and the nearest loser with the WLA is difficult.

FIG. 6B shows a state of over-regulation in which regulation of the comparison signal C by the comparison signal regulation unit SR is excessive. In this case, from the above discussion, it arises that the output voltage corresponding to the nearest loser row whose signal current is larger than the winner row is concentrated on the low side of the amplification characteristic curve of the PPA, followed by an output voltage corresponding to other loser rows whose signal current is large. Like FIG. 6A, identification of the winner row and the nearest loser with the WLA is difficult.

FIG. 6C shows a case in which the feedback circuit shown in FIG. 5 is operated under good conditions so that the operation point of the winner row and the operation point of the nearest loser row are self-adaptively regulated in a region capable of providing maximum amplification on the amplification characteristic curve of the PPA. At this time, a maximum amplification output voltage at the winner/loser distance is obtained, so that retrieval of the reference data based on the input data is carried out in the associative memory under good conditions.

If together with the fifth embodiment of FIG. 5, pMOS-transistors are used for the WWC, as shown in FIGS. 2B and 3, it is necessary to replace the nMOS-transistors Q21 to Q24 shown in FIG. 5 with pMOS ones and then the pMOS-transistors Q25 and Q26 with nMOS ones and to invert the polarity of the enable signal En and to exchange the power supply terminal VDD with the ground terminal.

Sixth Embodiment

Next, a sixth embodiment of the present invention will be described with reference to FIGS. 7 and 8.

In the sixth embodiment, an input method of the feedback signal F from the winner line-up amplifier WLA to the weighted word comparator WWC and output regulation of the comparison signal C from the WWC according to the feedback signal F will be described.

Figure 7:
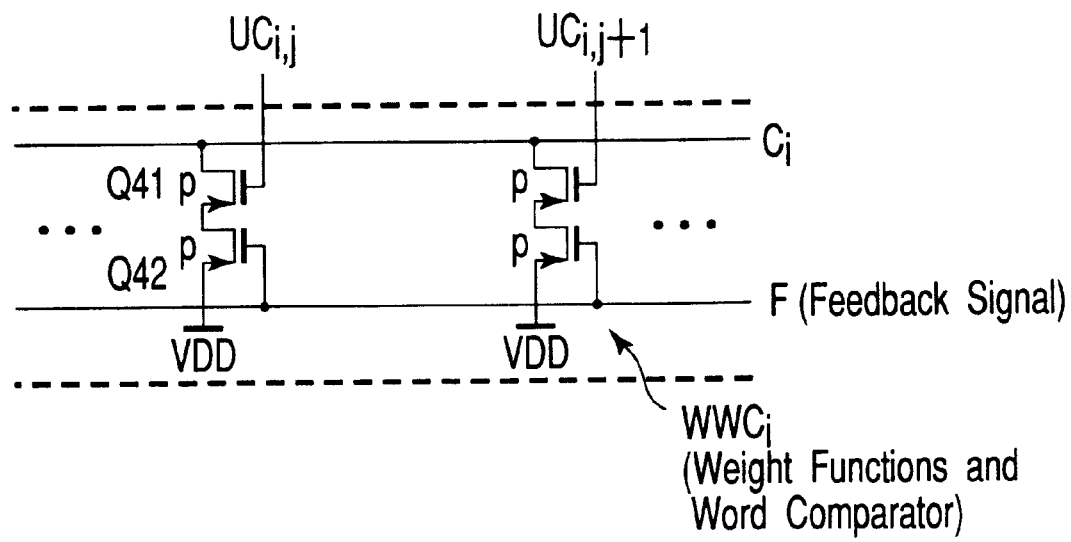
FIG. 7 is a diagram showing a structure of the weighted word comparator and a feedback method.

The WWC$_i$ shown in FIG. 7 is composed of a series connected circuit comprising; a pMOS-transistor Q41 for receiving the output of the UC$_{i,j}$ which compares, for example, 1-bit units; and a pMOS-transistor Q42 for receiving the feedback signal F from the WLA at its gate. If the feedback signal F increases, the pMOS-transistor Q42 is turned further off. Thus, comparison signal current C$_i$ of the WWC$_i$ connected to the VDD through the pull-up transistor (Q22 in FIG. 5) decreases so as to regulate C$_i$. Although the WWC$_i$ shown in FIG. 7 ensures a large gain in regulation of the comparison signal current C$_i$, it is necessary to add a transistor per bit in the memory array.

Figure 8:
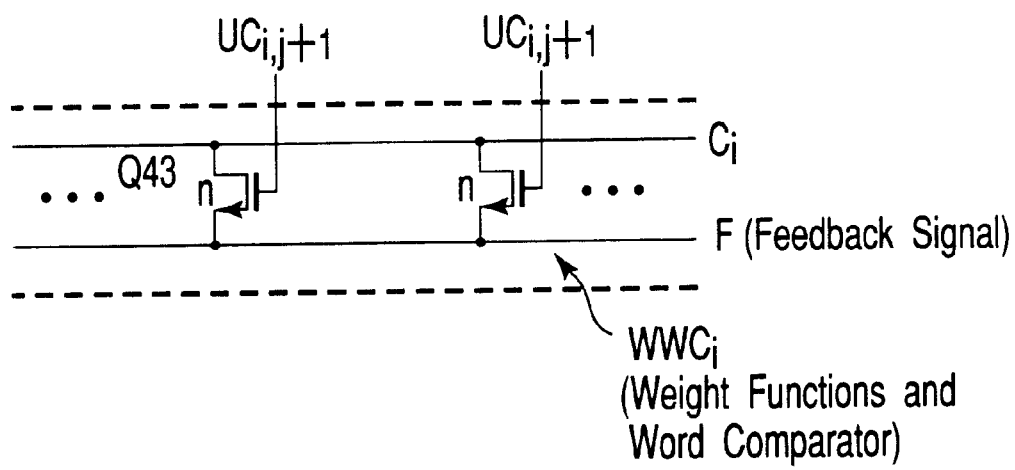
FIG. 8 is a diagram showing another structure of the weighted word comparator and another feedback method.

The WWC$_i$ shown in FIG. 8 is composed of only an nMOS-transistor Q43 for receiving the output from the UC$_{i,j}$ which compares, for example, 1-bit units at its gate. The feedback signal F from the WLA is input to a source of the nMOS-transistor Q43. If the feedback signal F increases, the drain current of the nMOS-transistor Q43 decreases, thereby making it possible to regulate the comparison signal current C$_i$ of the WWC$_i$. Although the number of transistors in the WWC$_i$ shown in FIG. 8 is small, it is necessary to add wiring per bit within the memory field.

The advantage of using the feedback in the WWC is that, particularly in the case of a large distance, amplification of the difference between the winner output from the WWC and the output of the nearest loser is improved irrespective of any fluctuation due to the manufacturing process.

Seventh Embodiment

Next, a seventh embodiment of the present invention will be described with reference to FIG. 9.

In the seventh embodiment, an improved circuit in circuit in comparison to the winner line-up amplifier WLA described in the fifth embodiment and a method for transmitting the feedback signal F to the WWC, which carries out the weighted word comparison in the memory array, will be described.

Figure 9:
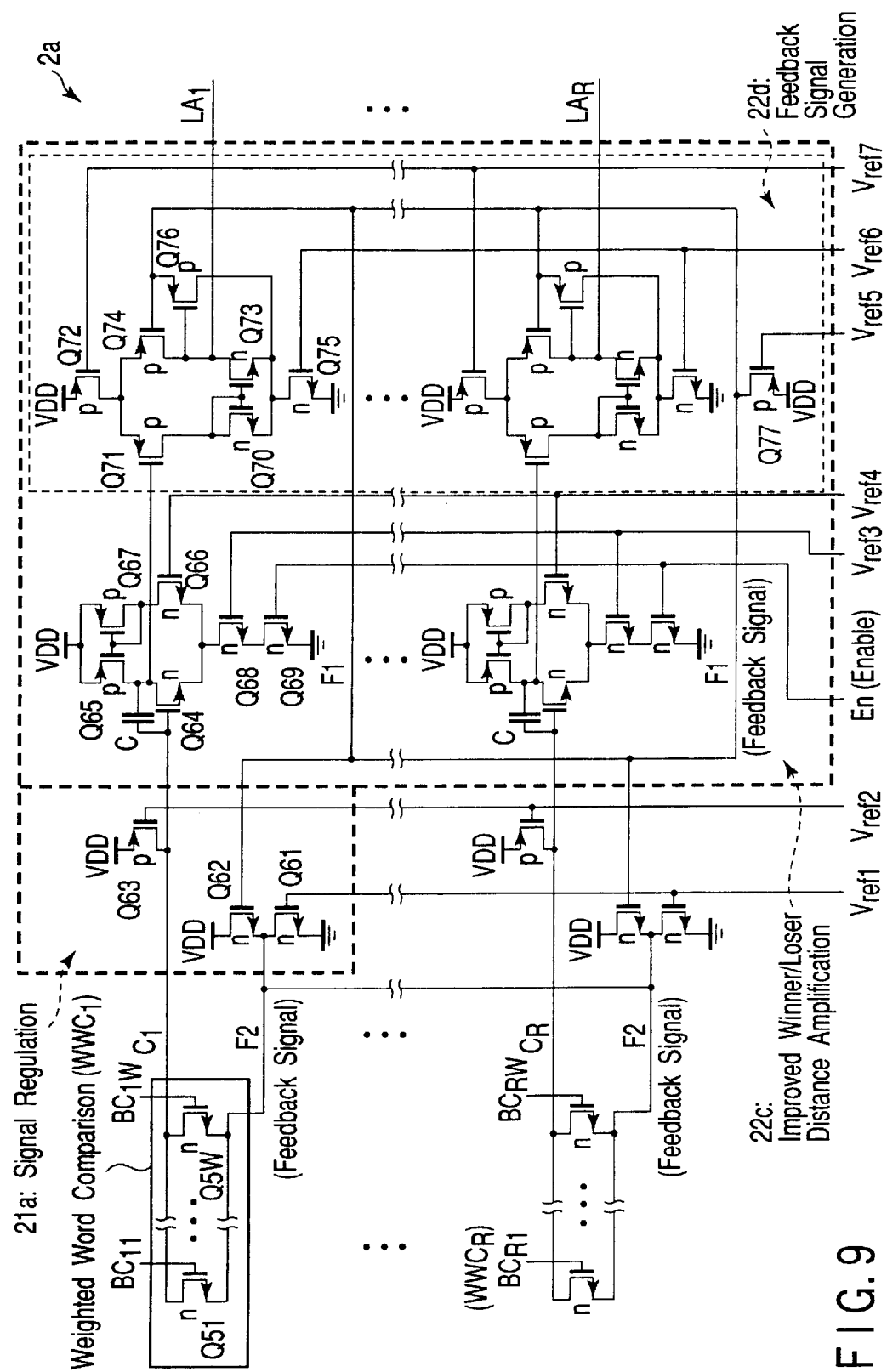
FIG. 9 is a diagram showing a structure of an improved winner line-up circuit incorporating a feedback circuit to the weighted word comparator according to a seventh embodiment of the invention.

A WLA 2a shown in FIG. 9 is an example for an improvement of the WLA 2 of FIG. 5. In the WLA 2a, a current mirror circuit having a high amplification factor is employed to amplify the distance between the winner and the losers and a Min/Max circuit (for example, R. G. Carvajal et al., "High-Speed High-Precision Min/Max Circuit in CMOS Technology", Electronics Letters, vol. 36, pp. 697–699, 2000) is employed as a circuit for generating the feedback signal F and as a circuit for further amplifying the distance between the winner and the losers to a larger extent.

The WWC/WLA circuit using these circuits can expand the range in which the distance between the winner and the losers can be retrieved to 1,000 to 10,000 bits and further reduce power dissipation at the comparison signal regulation unit SR 21a to 0.1 mW or less.

The WLA 2a of the seventh embodiment employs a high-speed current mirror amplifier using nMOS and pMOS-transistors Q64 to Q69, having a higher amplification factor, instead of the push-pull amplifier PPA of FIG. 5. Further, the feedback circuit is configured with a Min/Max circuit, operating at high speed, and comprising nMOS and pMOS-transistors Q70 to Q76 for each row as well as a pMOS-transistor Q77 common for all rows. The feedback signal F2 shifts down the voltage of the feedback signal F1 by approximately the threshold voltage of the nMOS-transistor Q62 and is input to a terminal of the WWC which has supplied VSS originally (see FIG. 8).

Because the voltage between the source and drain of the transistor constituting the WWC is changed if the feedback signal is changed, the effect of feedback appears in the output of the WWC as a square effect. Thus, it is possible to amplify the distance between the winner and the nearest loser particularly for larger distances to the input data, as compared to the WLA 2 shown in FIG. 5, largely irrespective of any fluctuation due to the manufacturing process.

Meanwhile if in the seventh embodiment, the pMOS-transistor shown in FIG. 2B or FIG. 3 is used for the WWC shown in FIG. 9, it is necessary to replace the nMOS-transistors shown in FIG. 9 with pMOS ones and the pMOS ones with an nMOS ones, invert the polarity of the enable signal En and exchange the power supply terminal VDD with the ground terminal.

Eighth Embodiment

Next, an eighth embodiment of the present invention will be described with reference to FIG. 10.

Regarding the eighth embodiment, a structure of a winner-take-all circuit WTA 3 will be described.

Figure 10:
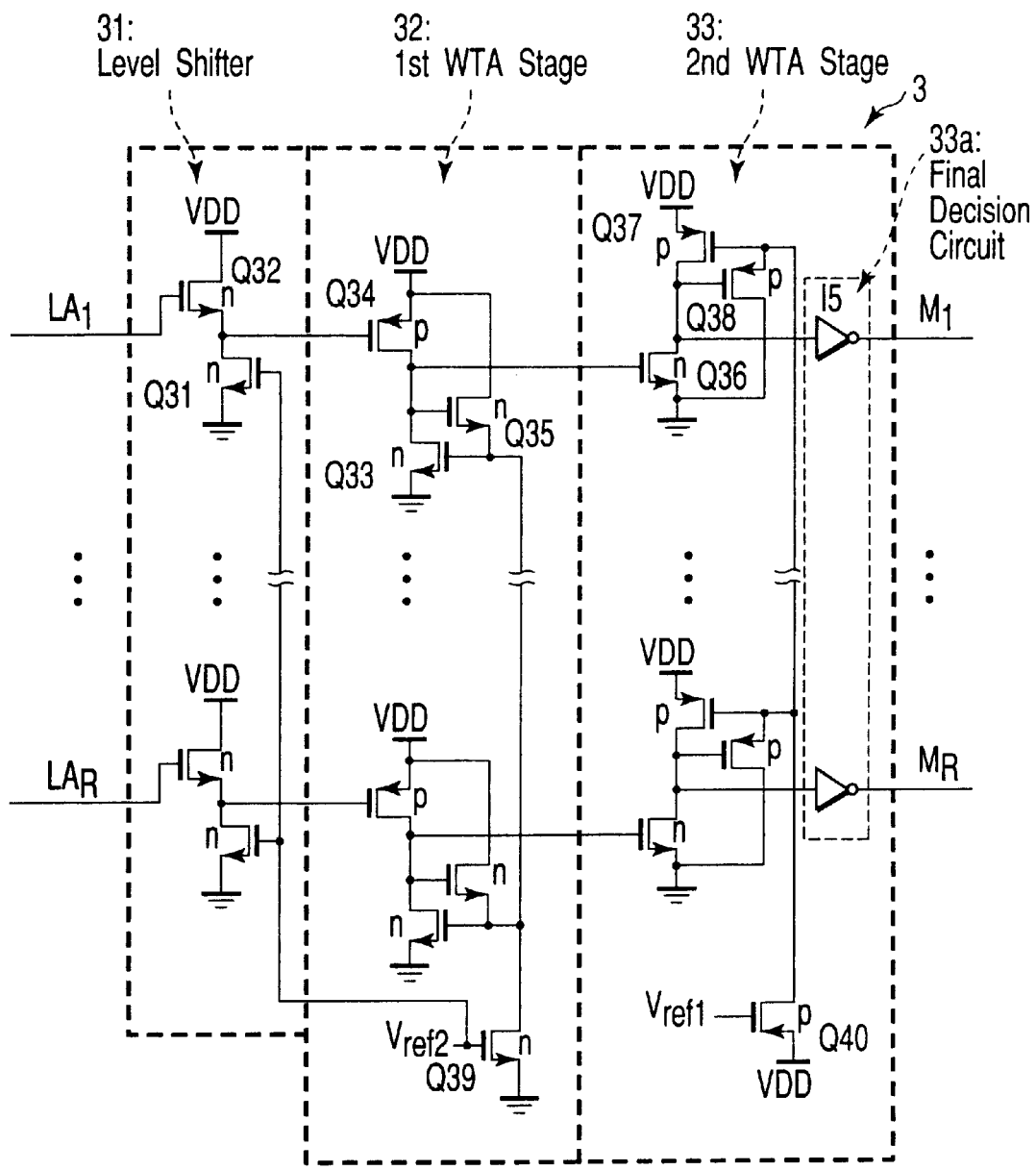
FIG. 10 is a diagram showing a structure of a winner-take-all circuit according to an eighth embodiment of the invention.

The WTA 3 of circuit configuration O(R) shown in FIG. 10 is implemented with about 10 transistors per row. First, an output signal LA of the WLA is regulated for the WTA to be activated in a region of large amplification using a level-down shifter composed of the nMOS-transistors Q31 and Q32. This level-down shifter is provided only when the level of the output signal LA needs to be reduced.

A major portion of this circuit is a WTA circuit, called WTA stage here, having common source-followers Q35 (1st WTA stage) or Q38 (2nd WTA stage) proposed by Lazzaro at al (J. Lazzaro et al., "Winner-Take-All network of O(N) complexity", in Advances in Neural Information Processing Systems, I. D. S. Touretzky Ed., San Mateo, Calif.: Morgan Kaufmann, 1989).

Then, a final digital retrieval result is output by a decision circuit.

A first-stage WTA 32 comprising the transistors Q33, Q34 and Q35 utilizes the pMOS-transistor Q34 in order to transform the output voltage of the level-down shifter 31 to a current. Because the output voltage LA of the WLA 2 becomes lowest at the winner row, the output voltage of the level-down shifter at the winner row becomes also lowest. Therefore, the current thought the transistor Q34 of the winner row is maximized. This maximum current is transformed to a maximum voltage at the output of the first-stage WTA 32 while the output of all other rows is substantially suppressed.

The second stage WTA 33 executes transformation of voltage/current/voltage in the same way as the first stage so as to amplify the distance between the winner and the losers. The voltage of the winner becomes lowest at the output of the WTA 33 of the second stage. A final decision circuit 33a is composed of inverters I5 with adjusted switching-threshold voltages so as to match with the output-voltage levels of the second stage WTA 33. A "1" is output for the winner row as a match signal M by this circuit, while a "0" is output for the loser rows.

Although in the eighth embodiment, an example in which the winner-take-all circuit is composed of two WTA stages, the winner-take-all circuit may be configured with three stages or more or may be configured with a single stage WTA. If pMOS-transistor are used in the WWC, it is necessary to replace the nMOS-transistors of FIG. 10 with pMOS ones and the pMOS ones with an nMOS ones and exchange the power supply terminal VDD with the ground terminal.

Ninth Embodiment

Next, a ninth embodiment of the present invention will be described with reference to FIGS. 11–13.

In the ninth embodiment, an associative memory chip of the present invention which is manufactured using CMOS technology and its performance will be described.

Figure 11:
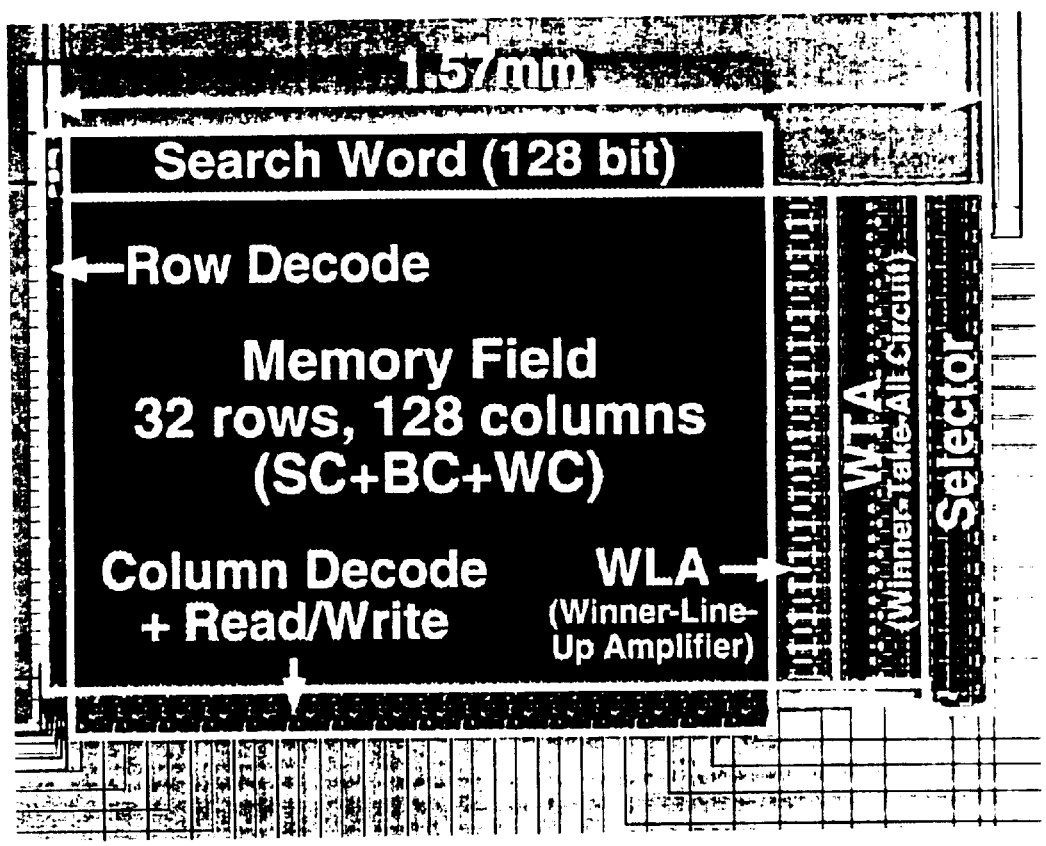
FIG. 11 is an image showing a CMOS associative-memory chip according to a ninth embodiment of the invention.
Figure 12:
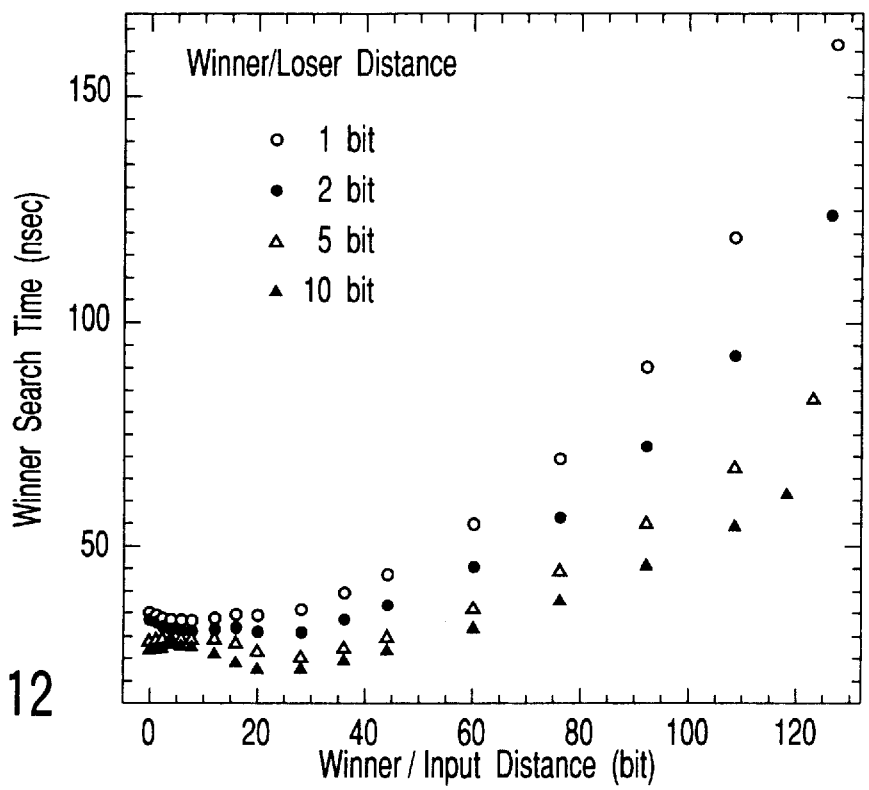
FIG. 12 is a diagram in which the winner search time is obtained by simulation as a function of winner/input distance with winner/nearest loser distance as a parameter of the invention.

FIG. 11 shows an associative memory chip for minimum Hamming distance retrieval, capable of retrieving a winner of up to 127 bits from 32 rows, manufactured using CMOS technology for a minimum line width of 0.6 $\mu$m. This associative memory chip is designed with the winner line-up amplifier WLA 2 according to the fifth embodiment shown in FIG. 5 and the winner-take-all circuit WTA 3 according to the eighth embodiment shown in FIG. 10.

Because a memory field (array) of 32 rows and 128 columns is formed in the center of the chip and retrieval based on the Hamming distance is used, the memory array comprises a storage cell (SC) for each bit, a bit comparator (BC) and a word comparator (WC) not weighted.

A 128-bit search word portion is disposed on a top side of the chip while a column decode and read/write portion is disposed on a lower side of the chip. A selector for fetching out the WLA, WTA and output is disposed on a right side of the chip. Here, the WLA and WTA circuits occupy only a very small area equivalent to 14.3% of the entire associative memory in a chip size of 1.57 mm$^2$.

Next, a result of simulation on winner search time in the associative memory chip of FIG. 11 will be described. FIG. 12 shows cases where the distance between the winner and the losers is 1 bit, 2 bits, 5 bits and 10 bits with the time required for searching for the winner as a function of the winner distance.

Although it is evident that the search time can be reduced to 50 ns or less for an intermediate distance of about 50 bits, the search time increases at a greater distance and if the winner distance reaches 127 bits, the search time becomes 160 ns.

If the WLA circuit is improved as described in the seventh embodiment shown in FIG. 9, it has been found that the search time may be 100 ns or less even if the distance between the winner and the losers is as small as 1 bit and the distance between winner and input is large.

Because the associative memory architecture of the present invention has a large search margin, its reliability is high in the case of a good match that means if the distance of the winner is small or the distance between the winner and the losers is large. Further, in the case of a bad match or if the distance of the winner is large while the distance between the winner and the losers is small, its practical level can be maintained while the search margin is small and the reliability drops.

Figure 13:
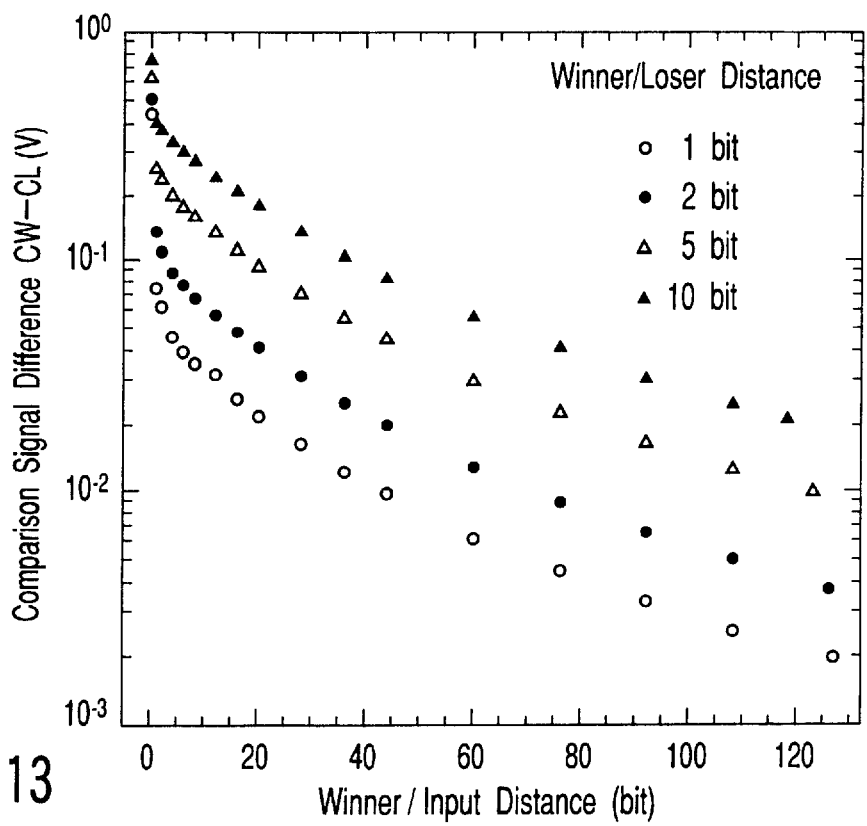
FIG. 13 is a diagram in which the comparison signal difference is obtained by simulation as a function of winner/input distance with winner/nearest loser distance as a parameter.

FIG. 13 shows a difference in the WC output regulated by the WLA between the winner row and the nearest loser row. For the cases where the distance between the winner and the nearest loser is 1 bit, 2 bits, 5 bits and 10 bits, the comparison signal difference ($C_W$–$C_L$) between the winner and losers is expressed as a function of the winner distance. FIG. 13 indicates that in the case of a "very good match", the comparison signal difference reaches several hundred mV while in the case of a "very bad match", the comparison signal difference is as small as 2 to 3 mV. In this way, the magnitude of the comparison signal differences becomes a quantity for indicating the match quality.

The associative memory architecture of the present invention has the feature that its tolerance of fluctuation in the manufacturing process and of noise is large because it can code distance information stably by means of a regulating self-adaptive WLA with its feedback circuit. Further, the circuits of the WLA described in FIGS. 5 and 9 and the WTA described in FIG. 10 have the feature that the number of transistors used in the circuit (degree of integration of the circuit) is proportional to R, the number of rows (number of reference data items) in the memory array. However, dispersion of the transistor parameters in the chip may cause erroneous operation in the output portion of the match signal, thereby possibly limiting the searchable range.

The present invention is not restricted to the above described embodiments. Further, the present invention may be subject to a range of modifications without departing from the gist thereof.

According to the prior art, generally, an artificial intelligence system is implemented on a high performance computer system with complex software because hardware having a high area efficiency is impossible to achieve. However, the associative memory of the present invention is capable of application in pattern recognition, artificial intelligence systems, banking systems and the like with plural compact chips or only a single chip.

What is claimed is:

1. A semiconductor associative memory including a memory array comprising:
   unit storage circuits each having k bits arranged in R rows and W columns (R, W, k are natural numbers);
   unit comparison circuits arranged in R rows and W columns for comparing input data of W×k bits in terms of word length and reference data stored in said unit storage circuit at every unit of k bit;
   weighted word comparators for weighting each bit of output data from each row of said unit comparison circuits;
   row decoders of R rows; and
   column decoders of W×k columns.

2. A semiconductor associative memory according to claim 1, wherein said unit in said memory array is composed of binary-coded data and the bit number k of said unit is k=1 in the case where the Hamming distance is used to search for reference data with said input data, and k>1 in the case where the Manhattan distance is used.

3. A semiconductor associative memory according to claim 2, further comprising a winner line-up amplifier, providing connections for each row in said memory array,
   said winner line-up amplifier comprising:
      a winner/loser distance amplification unit;
      a feedback signal generation section included in said winner/loser distance amplification unit;
      a comparison signal regulation unit for regulating a comparison signal of said weighted word comparator so that the amplification factor of said winner/loser distance amplification unit is maximized by using a feedback signal output from said feedback signal generation section; and
      a feedback signal coding section for outputting the match quality of the winner by coding the feedback signal.

4. A semiconductor associative memory according to claim 3, wherein said winner/loser distance amplification unit comprises, for each row of said memory array, a push-pull amplifier, two transistors for receiving not-inverted/inverted enable signals, and a compensation capacitor;
   said feedback signal generation section comprises:
      a source-follower pull-down transistor provided on each row of said memory array, for receiving an output of said push-pull amplifier with a gate thereof; and
      a pull-up transistor common to all rows of said memory array and connected to each of said pull-down transistors in series;
   said comparison signal regulation unit comprises, for each row of said memory array, a pass transistor for regulating the output-signal current from said weighted word comparator and a source-follower pull-up transistor for converting said output signal current to an intermediate potential,
   wherein said feedback signal is input to a gate of said source-follower pull-up transistor while said enable signal is input to a gate of said pass transistor.

5. A semiconductor associative memory according to claim 4, further comprising a winner-take-all circuit, providing connections for each row in said memory array,
   said winner-take-all circuit comprising:
      a level shifter configured as required;
      a winner-take-all amplifier of n stages (n is a positive integer) in order to amplify the winner/loser distance output signals of said winner/loser distance amplification unit further; and
      a final decision circuit connected to an output portion of the n-th stage of said winner-take-all amplifier.

6. A semiconductor associative memory according to claim 4, further comprising a winner-take-all circuit, providing connections for each row of said memory array,
   said winner-take-all circuit including a level shifter and a winner-take-all amplifier of a single stage,
   said level shifter shifting the levels of the output signal voltages of said winner/loser distance amplification unit so that the amplification factor of said winner-take-all amplifier of a single stage is maximized, said winner-take-all amplifier of the single stage including transistors for converting said shifted output signal voltages to current changes in said amplifier and transistors for converting the current changes in said amplifier to output signal voltages of said winner-take-all amplifier of the single stage, said winner-take-all amplifier of the single stage including a final decision circuit, provided at an output portion thereof, composed of inverters with adjusted switching-threshold voltages so as to match said output signal voltages of said winner-take-all amplifier of the single stage.

7. A semiconductor associative memory according to claim 4, further comprising a winner-take-all circuit, providing connections for each row in said memory array, said winner-take-all circuit including a level shifter and a winner-take-all amplifier of n stages (n is an integer greater than 1), said level shifter shifting the levels of the output signal voltages of said winner/loser distance amplification unit so that the amplification factor of the winner-take-all amplifier of the first stage is maximized, said winner-take-all amplifier of the first stage comprising transistors for converting said shifted output signal voltages to current changes in said amplifier and transistors for converting the current changes in said amplifier to output signal voltages of said winner-take-all amplifier of the first stage, said winner-take-all amplifier of the i-th stage (i is an integer greater than 1 but not greater than n) including transistors for converting said output signal voltages of said winner-take-all amplifier of the (i−1)-th stage to current changes in said amplifier and transistors for converting the current changes in said amplifier to output signal voltages of said winner-take-all amplifier of the i-th stage, said winner-take-all amplifier of the n-th stage including a final decision circuit provided at an output portion thereof composed of inverters with adjusted switching-threshold voltages so as to match said output signal voltages of said winner-take-all amplifier of the n-th stage.

8. A semiconductor associative memory according to claim 3, wherein the winner/loser distance amplification unit comprises, for each row in said memory array, a current mirror amplifier and a compensation capacitor, said feedback signal generation portion includes a Min/Max circuit which operates at high speed;

said comparison signal regulation unit includes a source-follower pull-up transistor, for converting the output signal current from said weighted word comparator to an intermediate potential, and a level shifter for shifting said feedback signal in terms of its voltage level and inputting said shifted feedback signal into the source of each of said transistors constituting said weighted word comparator.

9. A semiconductor associative memory according to claim 8, further comprising a winner-take-all circuit, providing connections for each row in said memory array, said winner-take-all circuit comprising:
a level shifter configured as required;
a winner-take-all amplifier of n stages (n is a positive integer) in order to amplify the winner/loser distance output signals of said winner/loser distance amplification unit further; and
a final decision circuit connected to the output portion of the n-th stage in said winner-take-all amplifier.

10. A semiconductor associative memory according to claim 8, further comprising a winner-take-all circuit, providing connection for each row in said memory array, said winner-take-all circuit including a level shifter and a winner-take-all amplifier of a single stage, said level shifter shifting the levels of the output signal voltages of said winner/loser distance amplification unit so that the amplification factor of said winner-take-all amplifier of the single stage is maximized, said winner-take-all amplifier of the single stage including transistors for converting said shifted output signal voltages to current changes in said amplifier and transistors for converting the current changes in said amplifier to output signal voltages of said winner-take-all amplifier of the single stage, said winner-take-all amplifier of the single stage including a final decision circuit, provided at an output portion thereof, composed of inverters with adjusted switching-threshold voltages so as to match said output signal voltages of said winner-take-all amplifier of the single stage.

11. A semiconductor associative memory according to claim 8, further comprising a winner-take-all circuit, providing connections for each row of said memory array, said winner-take-all circuit including a level shifter and a winner-take-all amplifier of n stages (n is an integer greater than 1), said level shifter shifting the levels of the output signal voltages of said winner/loser distance amplification unit so that the amplification factor of the winner-take-all amplifier of the first stage is maximized, said winner-take-all amplifier of the first stage comprising transistors for converting said shifted output signal voltages to current changes in said amplifier and transistors for converting the current changes in said amplifier to output signal voltages of said winner-take-all amplifier of the first stage, said winner-take-all amplifier of the i-th stage (i is an integer greater than 1 but not greater than n) including transistors for converting said output signal voltages of said winner-take-all amplifier of the (i−1)-th stage to current changes in said amplifier and transistors for converting the current changes in said amplifier to output signal voltages of said winner-take-all amplifier of the i-th stage, said winner-take-all amplifier of the n-th stage including a final decision circuit, provided at an output portion thereof, composed of inverters with adjusted switching-threshold voltages so as to match said output signal voltages of said winner-take-all amplifier of the n-th stage.

12. A semiconductor associative memory according to claim 3, further comprising a winner-take-all circuit, providing connections for each row of said memory array, said winner-take-all circuit comprising:
a level shifter configured as required;
winner-take-all amplifiers of n stages (n is a positive integer) in order to amplify the winner/loser distance output signals of said winner/loser distance amplification unit further; and
a final decision circuit connected to the output portion of the n-th stage of said winner-take-all amplifier.

13. A semiconductor associative memory according to claim 3, further comprising a winner-take-all circuit, providing connections for each row in said memory array, said winner-take-all circuit including a level shifter and a winner-take-all amplifier of a single stage, said level shifter shifting the levels of the output signal voltages of said winner/loser distance amplification unit so that the amplification factor of the winner-take-all amplifier of the single stage is maximized, said winner-take-all amplifier of the single stage including transistors for converting said shifted output signal voltages to current changes in said amplifier and transistors for converting the current changes in said amplifier to output signal voltages of said winner-take-all amplifier of the single stage, said winner-take-all amplifier of said single stage including a final decision circuit, provided at an output portion thereof, composed of inverters with adjusted switching-threshold voltages so as to match said output signal voltages of said winner-take-all amplifier of the single stage.

14. A semiconductor associative memory according to claim 3, further comprising a winner-take-all circuit, providing connections for each row of said memory array, said winner-take-all circuit including a level shifter and a winner-take-all amplifier of n stages (n is an integer greater than 1), said level shifter shifting the levels of the output signal voltages of said winner/loser distance amplification unit so that the amplification factor of the winner-take-all amplifier of the first stage is maximized, said winner-take-all amplifier of the first stage comprising transistors for converting said shifted output signal voltages to current changes in said amplifier and transistors for converting the current changes in said amplifier to output signal voltages of said winner-take-all amplifier of the first stage, said winner-take-all amplifier of the i-th stage (i is an integer greater than 1 but not greater than n) including transistors for converting said output signal voltages of said winner-take-all amplifier of the (i−1)-th stage to current changes in said amplifier and transistors for converting the current changes in said amplifier to output signal voltages of said winner-take-all amplifier of the i-th stage, said winner-take-all amplifier of the n-th stage including a final decision circuit, provided at an output portion thereof composed of inverters with adjusted switching-threshold voltages so as to match said output signal voltages of said winner-take-all amplifier of the n-th stage.

15. A semiconductor associative memory according to claim 1, wherein when the retrieval of said reference data based on said input data is carried out using the Hamming distance, said unit storage circuit is composed of an SRAM type memory cell, said unit comparison circuit is composed of a 2-input EXOR circuit or 2-input EXNOR circuit each connected to a complementary output portion of a latch circuit constituting said SRAM type memory cell, said weighted word comparator includes a transistor, or two transistors connected to each other in series, connected to said 2-input EXOR circuit or said 2-input EXNOR circuit.

16. A semiconductor associative memory according to claim 15, further comprising a winner line-up amplifier, providing connections for each row in said memory array, said winner line-up amplifier comprising:

a winner/loser distance amplification unit;

a feedback signal generation section included in said winner/loser distance amplification unit;

a comparison signal regulation unit for regulating a comparison signal of said weighted word comparator so that the amplification factor of said winner/loser distance amplification unit is maximized by using a feedback signal output from said feedback signal generation section; and a feedback signal coding section for outputting the match quality of the winner by coding the feedback signal.

17. A semiconductor associative memory according to claim 15, wherein weighting of the output data in said weighted word comparator is carried out by selecting the value of a ratio of the gate width to the gate length of any one of said one transistor or said two transistors connected to each other in series, constituting said weighted word comparator.

18. A semiconductor associative memory according to claim 16, wherein said winner/loser distance amplification unit comprises, for each row of said memory array, a push-pull amplifier, two transistors for receiving not-inverted/inverted enable signals, and a compensation capacitor;

said feedback signal generation section comprises:
a source-follower pull-down transistor, provided on each row of said memory array, for receiving an output of said push-pull amplifier with a gate thereof; and a pull-up transistor common to all rows of said memory array and connected to each of said pull-down transistors in series, said comparison signal regulation unit comprises, for each row of said memory array, a pass transistor for regulating the output signal current from said weighted word comparator and a source-follower pull-up transistor for converting said output signal current to an intermediate potential, wherein said feedback signal is input to a gate of said source-follower pull-up transistor while said enable signal is input to a gate of said pass transistor.

19. A semiconductor associative memory according to claim 18, further comprising a winner-take-all circuit, providing connections for each row in said memory array, said winner-take-all circuit comprising:
a level shifter configured as required;
a winner-take-all amplifier of n stages (n is a positive integer) in order to amplify the winner/loser distance output signals of said winner/loser distance amplification unit further; and
a final decision circuit connected to an output portion of the n-th stage of said winner-take-all amplifier.

20. A semiconductor associative memory according to claim 18, further comprising a winner-take-all circuit, providing connections for each row in said memory array, said winner-take-all circuit including a level shifter and a winner-take-all amplifier of a single stage, said level shifter shifting the levels of the output signal voltages of said winner/loser distance amplification unit so that the amplification factor of said winner-take-all amplifier of the single stage is maximized, said winner-take-all amplifier of the single stage including transistors for converting said shifted output signal voltages to current changes in said amplifier and transistors for converting the current changes in said amplifier to output signal voltages of said winner-take-all amplifier of the signal stage, said winner-take-all amplifier of the single stage including a final decision circuit, provided at an output portion thereof, composed of inverters with adjusted switching-threshold voltages so as to match said output signal voltages of said winner-take-all amplifier of the single stage.

21. A semiconductor associative memory according to claim 18, further comprising a winner-take-all circuit, providing connections for each row in said memory array, said winner-take-all circuit including a level shifter and a winner-take-all amplifier of n stages (n is an integer greater than 1), said level shifter shifting the levels of the output signal voltages of said winner/loser distance amplification unit so that the amplification factor of the winner-take-all amplifier of the first stage is maximized, said winner-take-all amplifier of the first stage comprising transistors for converting said shifted output signal voltages to current changes in said amplifier and transistors for converting the current changes in said amplifier to output signal voltages of said winner-take-all amplifier of the first stage, said winner-take-all amplifier of the i-th stage (i is an integer greater than 1 but not greater than n) including transistors for converting said output signal voltages of said winner-take-all amplifier of the (i–1)-th stage to current changes in said amplifier and transistors for converting the current changes in said amplifier to output signal voltages of said winner-take-all amplifier of the i-th stage, said winner-take-all amplifier of the n-th stage including a final decision circuit, provided at an output portion thereof composed of inverters with adjusted switching-threshold voltages so as to match said output signal voltages of said winner-take-all amplifier of the n-th stage.

22. A semiconductor associative memory according to claim 16, wherein the winner/loser distance amplification unit comprises, for each row in said memory array, a current mirror amplifier and a compensation capacitor, said feedback signal generation portion includes a Min/Max circuit which operates at high speed;

said comparison signal regulation unit includes a source-follower pull-up transistor, for converting the output signal current from said weighted word comparator to an intermediate potential, and a level shifter for shifting said feedback signal in terms of its voltage level and inputting said shifted feedback signal into the source of each of said transistors constituting said weighted word comparator.

23. A semiconductor associative memory according to claim 22, further comprising a winner-take-all circuit, providing connections for each row in said memory array, said winner-take-all circuit comprising:
a level shifter configured as required;
a winner-take-all amplifier of n stages (n is a positive integer) in order to amplify the winner/loser distance output signals of said winner/loser distance amplification unit further; and
a final decision circuit connected to an output portion of the n-th stage in said winner-take-all amplifier.

24. A semiconductor associative memory according to claim 22, further comprising a winner-take-all circuit, providing connections for each row in said memory array, said winner-take-all circuit including a level shifter and a winner-take-all amplifier of a single stage, said level shifter shifting the levels of the output signal voltages of said winner/loser distance amplification unit so that the amplification factor of said winner-take-all amplifier of the single stage is maximized, said winner-take-all amplifier of the single stage including transistors for converting said shifted output signal voltages to current changes in said amplifier and transistors for converting the current changes in said amplifier to output signal voltages of said winner-take-all amplifier of a single stage, said winner-take-all amplifier of the single stage including a final decision circuit, provided at an output portion thereof, composed of inverters with adjusted switching-threshold voltages so as to match said output signal voltages of said winner-take-all amplifier of the single stage.

25. A semiconductor associative memory according to claim 22, further comprising a winner-take-all circuit, providing connections for each row of said memory array, said winner-take-all circuit including a level shifter and a winner-take-all amplifier of n stages (n is an integer greater than 1), said level shifter shifting the levels of the output signal voltages of said winner/loser distance amplification unit so that the amplification factor of the winner-take-all amplifier of the first stage is maximized, said winner-take-all amplifier of the first stage comprising transistors for converting said shifted output signal voltages to current changes in said amplifier and transistors for converting the current changes in said amplifier to output signal voltages of said winner-take-all amplifier of the first stage, said winner-take-all amplifier of the i-th stage (i is an integer greater than 1 but not greater than n) including a transistors for converting said output signal voltages of said winner-take-all amplifier of the (i–1)-th stage to current changes in said amplifier and transistors for converting the current changes in said amplifier to output signal voltages of said winner-take-all amplifier of the i-th stage, said winner-take-all amplifier of the n-th stage including a final decision circuit, provided at an output portion thereof, composed of inverters with adjusted switching-threshold voltages so as to match said output signal voltages of said winner-take-all amplifier of the n-th stage.

26. A semiconductor associative memory according to claim 16, further comprising a winner-take-all circuit, providing connections for each row of said memory array, said winner-take-all circuit comprising:
a level shifter configured as required;
winner-take-all amplifiers of n stages (n is a positive integer) in order to amplify the winner/loser-distance output signals of said winner/loser distance amplification unit further; and
a final decision circuit connected to the output portion of the n-th stage of said winner-take-all amplifier.

27. A semiconductor associative memory according to claim 16, further comprising a winner-take-all circuit, providing connections for each row in said memory array, said winner-take-all circuit including a level shifter and a winner-take-all amplifier of a single stage, said level shifter shifting the levels of the output signal voltages of said winner/loser distance amplification unit so that the amplification factor of the winner-take-all amplifier of the single stage is maximized, said winner-take-all amplifier of the single stage including transistors for converting said shifted output signal voltages to current changes in said amplifier and transistors for converting the current changes in said amplifier to output signal voltages of said winner-take-all amplifier of the single stage, said winner-take-all amplifier of said single stage including a final decision circuit, provided at an output portion thereof, composed of inverters with adjusted switching-threshold voltages so as to match said output signal voltages of said winner-take-all amplifier of the single stage.

28. A semiconductor associative memory according to claim 16, further comprising a winner-take-all circuit, providing connections for each row in said memory array, said winner-take-all circuit including a level shifter and a winner-take-all amplifier of n stages (n is an integer greater than 1), said level shifter shifting the levels of the output signal voltages of said winner/loser distance amplification unit so that the amplification factor of the winner-take-all amplifier of the first stage is maximized, said winner-take-all amplifier of the first stage comprising transistors for converting said shifted output signal voltages to current changes in said amplifier and transistors for converting the current changes in said amplifier to output signal voltages of said winner-take-all amplifier of the first stage, said winner-take-all amplifier of the i-th stage (i is an integer greater than 1 but not greater than n) including transistors for converting said output signal voltages of said winner-take-all amplifier of the (i−1)-th stage to current changes in said amplifier and transistors for converting the current changes in said amplifier to output signal voltages of said winner-take-all amplifier of the i-th stage, said winner-take-all amplifier of the n-th stage including a final decision circuit, provided at an output portion thereof, composed of inverters with adjusted switching-threshold voltages so as to match said output signal voltages of said winner-take-all amplifier of the n-th stage.

29. A semiconductor associative memory according to claim 1, wherein when retrieval of said reference data based on said input data is carried out using the Manhattan distance, said unit storage circuit includes a complementary input section and a complementary output section of k (>1) bits, said unit comparison circuit includes a function for subtracting an output signal of said complementary output section from an input signal of said complementary input section and a function for calculating the absolute value of the result of the subtraction, said weighted word comparator comprises a transistor, or two transistors connected to each other in series, connected to an output portion of said unit comparison circuit.

30. A semiconductor associative memory according to claim 29, further comprising a winner line-up amplifier, providing connections for each row in said memory array, said winner line-up amplifier comprising:
a winner/loser distance amplification unit;
a feedback signal generation section included in said winner/loser distance amplification unit;
a comparison signal regulation unit for regulating a comparison signal of said weighted word comparator so that the amplification factor of said winner/loser distance amplification unit is maximized by using a feedback signal output from said feedback signal generation section; and
a feedback signal coding section for outputting the match quality of the winner by coding the feedback signal.

31. A semiconductor associative memory according to claim 29, wherein weighting of the output data in said weighted word comparator is carried out by selecting the value of a ratio of the gate width to the gate length of any one of said one transistor or said two transistors connected to each other in series, constituting said weighted word comparator.

32. A semiconductor associative memory according to claim 30, wherein said winner/loser distance amplification unit comprises, for each row of said memory array, a push-pull amplifier, two transistors for receiving not-inverted/inverted enable signals, and a compensation capacitor, said feedback signal generation section comprises:
a source-follower pull-down transistor provided on each row of said memory array for receiving an output of said push-pull amplifier with a gate thereof; and
a pull-up transistor common to all rows of said memory array and connected to each of said pull-down transistors in series;

said comparison signal regulation unit comprises, for each row of said memory array, a pass transistor for regulating the output signal current from said weighted word comparator and a source-follower pull-up transistor for converting said output signal current to an intermediate potential, wherein said feedback signal is input to a gate of said source-follower pull-up transistor while said enable signal is input to a gate of said pass transistor.

33. A semiconductor associative memory according to claim 32, further comprising a winner-take-all circuit, providing connections for each row in said memory array, said winner-take-all circuit comprising:
a level shifter configured as required;
a winner-take-all amplifier of n stages (n is a positive integer) in order to amplify the winner/loser distance output signals of said winner/loser distance amplification unit further; and
a final decision circuit connected to an output portion of the n-th stage of said winner-take-all amplifier.

34. A semiconductor associative memory according to claim 32, further comprising a winner-take-all circuit, providing connections for each row in said memory array, said winner-take-all circuit including a level shifter and a winner-take-all amplifier of a single stage, said level shifter shifting the levels of the output signal voltages of said winner/loser distance amplification unit so that the amplification factor of said winner-take-all amplifier of the single stage is maximized, said winner-take-all amplifier of the single stage including transistors for converting said shifted output signal voltages to current changes in said amplifier and transistors for converting the current changes in said amplifier to output signal voltages of said winner-take-all amplifier of a single stage, said winner-take-all amplifier of the single stage including a final decision circuit, provided at an output portion thereof, composed of inverters with adjusted switching-threshold voltages so as to match said output signal voltages of said winner-take-all amplifier of the n-th stage.

35. A semiconductor associative memory according to claim 32, further comprising a winner-take-all circuit, providing connections for each row in said memory array, said winner-take-all circuit including a level shifter and a winner-take-all amplifier of n stages (n is an integer greater than 1), said level shifter shifting the levels of the output signal voltages of said winner/loser distance amplification unit so that the amplification factor of the winner-take-all amplifier of the first stage is maximized, said winner-take-all amplifier of the first stage comprising transistors for converting said shifted output signal voltages to current changes in said amplifier and transistors for converting the current changes in said amplifier to output signal voltages of said winner-take-all amplifier of the first stage, said winner-take-all amplifier of the i-th stage (i is an integer greater than 1 but not greater than n) including transistors for converting said output signal voltages of said winner-take-all amplifier of the (i–1)-th stage to current changes in said amplifier and transistors for converting the current changes in said amplifier to output signal voltages of said winner-take-all amplifier of the i-th stage, said winner-take-all amplifier of the n-th stage including a final decision circuit, provided at an output portion thereof, composed of inverters with adjusted switching-threshold voltages so as to match said output signal voltages of said winner-take-all amplifier of the n-th stage.

36. A semiconductor associative memory according to claim 30, wherein the winner/loser distance amplification unit comprises, for each row in said memory array, a current mirror amplifier and a compensation capacitor, said feedback signal generation portion includes a Min/Max circuit which operates at high speed;

said comparison signal regulation unit includes a source-follower pull-up transistor, for converting the output signal current from said weighted word comparator to an intermediate potential, and a level shifter for shifting said feedback signal in terms of its voltage level and inputting said shifted feedback signal into the source of each of said transistors constituting said weighted word comparator.

37. A semiconductor associative memory according to claim 36, further comprising a winner-take-all circuit, providing connection for each row in said memory array, said winner-take-all circuit comprising:
a level shifter configured as required;
a winner-take-all amplifier of n stages (n is a positive integer) in order to amplify the winner/loser distance output signals of said winner/loser distance amplification unit further; and
a final decision circuit connected to the output portion of the n-th stage in said winner-take-all amplifier.

38. A semiconductor associative memory according to claim 36, further comprising a winner-take-all circuit, providing connections for each row in said memory array, said winner-take-all circuit including a level shifter and a winner-take-all amplifier of a single stage, said level shifter shifting the levels of the output signal voltages of said winner/loser distance amplification unit so that the amplification factor of said winner-take-all amplifier of the single stage is maximized, said winner-take-all amplifier of a single stage including transistors for converting said shifted output signal voltages to current changes in said amplifier and transistors for converting the current changes in said amplifier to output signal voltages of said winner-take-all amplifier of a single stage, said winner-take-all amplifier of the single stage including a final decision circuit, provided at an output portion thereof, composed of inverters with adjusted switching-threshold voltages so as to match said output signal voltages of said winner-take-all amplifier of the single stage.

39. A semiconductor associative memory according to claim 36, further comprising a winner-take-all circuit, providing connection for each row of said memory array, said winner-take-all circuit including a level shifter and a winner-take-all amplifier of n stages (n is an integer greater than 1), said level shifter shifting the levels of the output signal voltages of said winner/loser distance amplification unit so that the amplification factor of the winner-take-all amplifier of the first stage is maximized, said winner-take-all amplifier of the first stage comprising transistors for converting said shifted output signal voltages to current changes in said amplifier and transistors for converting the current changes in said amplifier to output signal voltages of said winner-take-all amplifier of the first stage, said winner-take-all amplifier of the i-th stage (i is an integer greater than 1 but not greater than n) including transistors for converting said output signal voltages of said winner-take-all amplifier of the (i–1)-th stage to current changes in said amplifier and transistors for converting the current changes in said amplifier to output signal voltages of said winner-take-all amplifier of the i-th stage, said winner-take-all amplifier of the n-th stage including a final decision circuit, provided at an output portion thereof, composed of inverters with adjusted switching-threshold voltages so as to match said output signal voltages of said winner-take-all amplifier of the n-th stage.

40. A semiconductor associative memory according to claim 30, further comprising a winner-take-all circuit, providing connection for each row of said memory array, said winner-take-all circuit comprising:
a level shifter configured as required;
winner-take-all amplifiers of n stages (n is a positive integer) in order to amplify the winner/loser-distance output signals of said winner/loser distance amplification unit further, and
a final decision circuit connected to an output portion of the n-th stage of said winner-take-all amplifier.

41. A semiconductor associative memory according to claim 30, further comprising a winner-take-all circuit, providing connections for each row in said memory array, said winner-take-all amplifier including a level shifter and a winner-take-all amplifier of a single stage, said level shifter shifting the levels of the output signal voltages of said winner/loser distance amplification unit so that the amplification factor of said winner-take-all amplifier of the single stage is maximized, said winner-take-all amplifier of the single stage including transistors for converting said shifted output signal voltages to current changes in said amplifier and transistors for converting the current changes in said amplifier to output signal voltages of said winner-take-all amplifier of the single stage, said winner-take-all amplifier of said single stage including a final decision circuit, provided at an output portion thereof, composed of inverters with adjusted switching-threshold voltages so as to match said output signal voltages of said winner-take-all amplifier of the single stage.

42. A semiconductor associative memory according to claim 30, further comprising a winner-take-all circuit, providing connections for each row in said memory array, said winner-take-all circuit including a level shifter and a winner-take-all amplifier of n stages (n is an integer greater than 1), said level shifter shifting the levels of the output signal voltages of said winner/loser distance amplification unit so that the amplification factor of the winner-take-all amplifier of the first stage is maximized, said winner-take-all amplifier of the first stage comprising transistors for converting said shifted output signal voltages to current changes in said amplifier and transistors for converting the current changes in said amplifier to output signal voltages of said winner-take-all amplifier of the first stage, said winner-take-all amplifier of the i-th stage (i is an integer greater than 1 but not greater than n) including transistors for converting said output signal voltages of said winner-take-all amplifier of the (i−1)-th stage to current changes in said amplifier and transistors for converting the current changes in said amplifier to output signal voltages of said winner-take-all amplifier of the i-th stage, said winner-take-all amplifier of the n-th stage including a final decision circuit, provided at an output portion thereof, composed of inverters with adjusted switching-threshold voltages so as to match said output signal voltages of said winner-take-all amplifier of the n-th stage.

43. A semiconductor associative memory according to claim 1, further comprising a winner line-up amplifier, providing connections for each row in said memory array, said winner line-up amplifier comprising:
a winner/loser distance amplification unit;
a feedback signal generation section included in said winner/loser distance amplification unit;
a comparison signal regulation unit for regulating a comparison signal of said weighted word comparator so that the amplification factor of said winner/loser distance amplification unit is maximized by using a feedback signal output from said feedback signal generation section; and
a feedback signal coding section for outputting the match quality of the winner by coding the feedback signal.

44. A semiconductor associative memory according to claim 43, wherein said winner/loser distance amplification unit comprises, for each row of said memory array, a push-pull amplifier, two transistors for receiving not-inverted/inverted enable signals, and a compensation capacitor, said feedback signal generation section comprises:
a source-follower pull-down transistor provided on each row of said memory array for receiving an output of said push-pull amplifier with a gate thereof; and
a pull-up transistor common to all rows of said memory array and connected to each of said pull-down transistors in series, said comparison signal regulation unit comprises, for each row of said memory array, a pass transistor for regulating the output signal current from said weighted word comparator and a source-follower pull-up transistor for converting said output signal current to an intermediate potential, wherein said feedback signal is input to a gate of said source-follower pull-up transistor while said enable signal is input to a gate of said pass transistor.

45. A semiconductor associative memory according to claim 44, further comprising a winner-take-all circuit, providing connection for each row in said memory array, said winner-take-all circuit comprising:
a level shifter configured as required;
a winner-take-all amplifier of n stages (n is a positive integer) in order to amplify the winner/loser distance output signals of said winner/loser distance amplification unit further; and
a final decision circuit connected to an output portion of the n-th stage of said winner-take-all amplifier.

46. A semiconductor associative memory according to claim 44, further comprising a winner-take-all circuit, providing connection for each row in said memory array, said winner-take-all circuit including a level shifter and a winner-take-all amplifier of a single stage, said level shifter shifting the levels of the output signal voltages of said winner/loser distance amplification unit so that the amplification factor of said winner-take-all amplifier of the single stage is maximized, said winner-take-all amplifier of the single stage including transistors for converting said shifted output signal voltages to current changes in said amplifier and transistors for converting the current changes in said amplifier to output signal voltages of said winner-take-all amplifier of a single stage, said winner-take-all amplifier of the single stage including a final decision circuit, provided at an output portion thereof, composed of inverters with adjusted switching-threshold voltages so as to match said output signal voltages of said winner-take-all amplifier of the single stage.

47. A semiconductor associative memory according to claim 44, further comprising a winner-take-all circuit, providing connections for each row in said memory array, said winner-take-all circuit including a level shifter and a winner-take-all amplifier of n stages (n is an integer greater than 1), said level shifter shifting the levels of the output signal voltages of said winner/loser distance amplification unit so that the amplification factor of the winner-take-all amplifier of the first stage is maximized, said winner-take-all amplifier of the first stage comprising transistors for converting said shifted output signal voltages to current changes in said amplifier and transistors for converting the current change in said amplifier to output signal voltages of said winner-take-all amplifier of the first stage, said winner-take-all amplifier of the i-th stage (i is an integer greater than 1 but not greater than n) including transistors for converting said output signal voltages of said winner-take-all amplifier of the (i−1)-th stage to current changes in said amplifier and transistors for converting the current changes in said amplifier to output signal voltages of said winner-take-all amplifier of the i-th stage, said winner-take-all amplifier of the n-th stage including a final decision circuit, provided at an output portion thereof, composed of inverters with adjusted switching-threshold voltages so as to match said output signal voltages of said winner-take-all amplifier of the n-th stage.

48. A semiconductor associative memory according to claim 43, wherein the winner/loser distance amplification unit comprises, for each row in said memory array, a current mirror amplifier and a compensation capacitor, said feedback signal generation portion includes a Min/Max circuit which operates at high speed;

said comparison signal regulation unit includes a source-follower pull-up transistor, for converting the output signal current from said weighted word comparator to an intermediate potential, and a level shifter for shifting said feedback signal in terms of its voltage level and inputting said shifted feedback signal into the source of each of said transistors constituting said weighted word comparator.

49. A semiconductor associative memory according to claim 48, further comprising a winner-take-all circuit, providing connections for each row in said memory array, said winner-take-all circuit comprising:
a level shifter configured as required;
a winner-take-all amplifier of n stages (n is a positive integer) in order to amplify the winner/loser distance output signal of said winner/loser distance amplification unit further; and
a final decision circuit connected to the output portion of the n-th stage in said winner-take-all amplifier.

50. A semiconductor associative memory according to claim 48, further comprising a winner-take-all circuit, providing connections for each row in said memory array, said winner-take-all circuit including a level shifter and a winner-take-all amplifier of a single stage, said level shifter shifting the levels of the output signal voltages of said winner/loser distance amplification unit so that the amplification factor of said winner-take-all amplifier of the single stage is maximized, said winner-take-all amplifier of the signal stage including transistors for converting said shifted output signal voltages to current changes in said amplifier and transistors for converting the current changes in said amplifier to output signal voltages of said winner-take-all amplifier of a single stage, said winner-take-all amplifier of the single stage including a final decision circuit, provided at an output portion thereof, composed of inverters with adjusted switching-threshold voltages so as to match said output signal voltages of said winner-take-all amplifier of the single stage.

51. A semiconductor associative memory according to claim 48, further comprising a winner-take-all circuit, providing connections for each row of said memory array, said winner-take-all circuit including a level shifter and a winner-take-all amplifier of n stages (n is an integer greater than 1), said level shifter shifting the levels of the output signal voltages of said winner/loser distance amplification unit so that the amplification factor of the winner-take-all amplifier of the first stage is maximized, said winner-take-all amplifier of the first stage comprising transistors for converting said shifted output signal voltages to current changes in said amplifier and transistors for converting the current changes in said amplifier to output signal voltages of said winner-take-all amplifier of the first stage, said winner-take-all amplifier of the i-th stage (i is an integer greater than 1 but not greater than n) including transistors for converting said output signal voltages of said winner-take-all amplifier of the (i−1)-th stage to current changes in said amplifier and transistors for converting the current changes in said amplifier to output signal voltages of said winner-take-all amplifier of the i-th stage, said winner-take-all amplifier of the n-th stage including a final decision circuit, provided at an output portion thereof composed of inverters with adjusted switching-threshold voltages so as to match said output signal voltages of said winner-take-all amplifier of the n-th stage.

52. A semiconductor associative memory according to claim 43, further comprising a winner-take-all circuit, providing connections for each row of said memory array, said winner-take-all circuit comprising:
a level shifter configured as required;
winner-take-all amplifiers of n stages (n is a positive integer) in order to amplify the winner/loser-distance output signals of said winner/loser distance amplification unit further; and
a final decision circuit connected to the output portion of the n-th stage of said winner-take-all amplifier.

53. A semiconductor associative memory according to claim 43, further comprising a winner-take-all circuit, providing connections for each row in said memory array, said winner-take-all circuit including a level shifter and a winner-take-all amplifier of a single stage, said level shifter shifting the levels of the output signal voltages of said winner/loser distance amplification unit so that the amplification factor of said winner-take-all amplifier of the single stage is maximized, said winner-take-all amplifier of the single stage including transistors for converting said shifted output signal voltages to current changes in said amplifier and transistors for converting the current changes in said amplifier to output signal voltages of said winner-take-all amplifier of the single stage, said winner-take-all amplifier of said single stage including a final decision circuit, provided at an output portion thereof, composed of inverters with adjusted switching-threshold voltages so as to match said output signal voltages of said winner-take-all amplifier of the single stage.

54. A semiconductor associative memory according to claim 43, further comprising a winner-take-all circuit, providing connections for each row in said memory array, said winner-take-all circuit including a level shifter and a winner-take-all amplifier of n stages (n is an integer greater than 1), said level shifter shifting the levels of the output signal voltages of said winner/loser distance amplification unit so that the amplification factor of the winner-take-all amplifier of the first stage is maximized, said winner-take-all amplifier of the first stage comprising transistors for converting said shifted output signal voltages to current changes in said amplifier and transistors for converting the current changes in said amplifier to output signal voltages of said winner-take-all amplifier of the first stage, said winner-take-all amplifier of the i-th stage (i is an integer greater than 1 but not greater than n) including transistors for converting said output signal voltages of said winner-take-all amplifier of the (i−1)-th stage to current changes in said amplifier and transistors for converting the current changes in said amplifier to output signal voltages of said winner-take-all amplifier of the i-th stage, said winner-take-all amplifier of the n-th stage including a final decision circuit, provided at an output portion thereof, composed of inverters with adjusted switching-threshold voltages so as to match said output signal voltages of said winner-take-all amplifier of the n-th stage.

55. A semiconductor associative memory including:

a memory array comprising,
  unit storage circuits each having k bits arranged as R rows and W columns (R, W, k are natural numbers),
  unit comparison circuits arranged as R rows and W columns for comparing input data of W×k bits in terms of word length and reference data stored in said unit storage circuit at every unit of k bit,
  weighted word comparators for weighting each bit of output data from each row of said unit comparison circuits,
  row decoders of R rows, and
  column decoders of W×k columns;
a winner line-up amplifier, providing connections for each row in said memory array, comprising
  a winner/loser distance amplification unit,
  a feedback signal generation section included in said winner/loser distance amplification unit,
  a comparison signal regulation unit for regulating a comparison signal of said weighted word comparator so that the amplification factor of said winner/loser distance amplification unit is maximized by using a feedback signal output from said feedback signal generation section, and
  a feedback signal coding section for outputting the match quality of the winner by coding the feedback signal; and
a winner-take-all circuit, providing connection for each row in said memory array, comprising
  a level shifter configured as required,
  a winner-take-all amplifier of n stages (n is a positive integer) in order to amplify the winner/loser distance output signals of said winner/loser distance amplification unit, and
  a final decision circuit connected to the output portion of the n-th stage of said winner-take-all amplifier,
  wherein said feedback signal is input to a source of each transistor constituting said weighted word comparator or a gate of any one of two transistors connected to each other in series constituting said weighted word comparator.

56. A semiconductor associative memory according to claim 55, wherein when the conductivity type of each transistor constituting said weighted word comparator or two transistors connected in series constituting said weighted word comparator is inverted,
  the conductivity type of each of the transistors constituting said winner/loser distance amplification unit and said feedback signal generation section is inverted,
  the polarity of the enable signal of each of said winner/loser distance amplification unit and said feedback signal generation section is reversed and
  the conductivity type of the transistor constituting said winner-take-all circuit is inverted, while a power supply terminal and a ground terminal of each of said winner/loser distance amplification unit, said feedback signal generation section and said winner-take-all circuit are exchanged.

57. A semiconductor associative memory according to claim 55, wherein the number of transistors constituting said winner line-up amplifier and said winner-take-all circuit is proportional to the number of rows R in said memory array.

* * * * *